(12) United States Patent
Marino et al.

(10) Patent No.: US 9,214,538 B2
(45) Date of Patent: Dec. 15, 2015

(54) HIGH PERFORMANCE MULTIGATE TRANSISTOR

(75) Inventors: Fabio Alessio Marino, San Jose, CA (US); Paolo Menegoli, San Jose, CA (US)

(73) Assignee: ETA Semiconductor Inc., San Jose, CA (US)

( * ) Notice: Subject to any disclaimer, the term of this patent is extended or adjusted under 35 U.S.C. 154(b) by 24 days.

(21) Appl. No.: 13/068,573

(22) Filed: May 16, 2011

(65) Prior Publication Data

US 2012/0292665 A1    Nov. 22, 2012

(51) Int. Cl.
| H01L 29/778 | (2006.01) |
| H01L 29/10 | (2006.01) |
| H01L 29/423 | (2006.01) |
| H01L 29/66 | (2006.01) |
| H01L 29/20 | (2006.01) |

(52) U.S. Cl.
CPC ........ *H01L 29/7787* (2013.01); *H01L 29/1029* (2013.01); *H01L 29/42316* (2013.01); *H01L 29/66462* (2013.01); *H01L 29/2003* (2013.01)

(58) Field of Classification Search
CPC ..................... H01L 29/7787; H01L 29/42316; H01L 29/1029; H01L 29/66462; H01L 29/2003
USPC ........... 257/76, 22, 77, 82, 192, 194, 195, 20, 257/24, 27, E29.246, E29.247, E29.248, 257/E29.249, E29.25, E29.251, E29.252, 257/E29.253, E29.254, E21.409; 438/151
See application file for complete search history.

(56) References Cited

U.S. PATENT DOCUMENTS

| 4,737,827 | A | * | 4/1988 | Ohta ............................. 257/192 |
| 5,161,235 | A | * | 11/1992 | Shur et al. ...................... 257/24 |
| 5,473,175 | A | | 12/1995 | Nikaido et al. |
| 5,497,019 | A | | 3/1996 | Mayer et al. |
| 5,726,462 | A | * | 3/1998 | Spahn et al. ..................... 257/76 |
| 6,188,137 | B1 | * | 2/2001 | Yagura et al. ................. 257/769 |
| 6,413,802 | B1 | | 7/2002 | Hu et al. |
| 6,815,772 | B2 | | 11/2004 | Takemura |
| 7,508,014 | B2 | * | 3/2009 | Tanimoto ...................... 257/192 |
| 7,528,423 | B2 | | 5/2009 | Ueno et al. |
| 7,663,161 | B2 | | 2/2010 | Kaibara et al. |
| 7,816,707 | B2 | | 10/2010 | Hikita et al. |
| 2008/0258184 | A1 | * | 10/2008 | Sankin et al. ................. 257/265 |
| 2009/0072272 | A1 | * | 3/2009 | Suh et al. ...................... 257/194 |
| 2010/0072517 | A1 | * | 3/2010 | Zampardi et al. ............. 257/197 |

* cited by examiner

*Primary Examiner* — Zandra Smith
*Assistant Examiner* — Lauren R Bell

(57) ABSTRACT

A novel semiconductor power transistor is presented. The semiconductor structure is simple and is based on a FET structure, where multiple channels and multiple gate regions are formed in order to achieve a lower specific on-resistance, and a higher control on the transport properties of the device. No dielectric layer is present between gate electrodes and device channels, decreasing the parasitic capacitance associated with the gate terminal. The fabrication of the device does not require Silicon On Insulator techniques and it is not limited to Silicon semiconductor materials. It can be fabricated as an enhancement or depletion device with much more control on the threshold voltage of the device, and with superior RF performance.

19 Claims, 21 Drawing Sheets

US 9,214,538 B2

HIGH PERFORMANCE MULTIGATE TRANSISTOR

BACKGROUND OF THE INVENTION

1. Field of the Invention

The present invention is in the field of semiconductor structures. The present invention is further in the field of semiconductor structures of transistor devices. The present invention further relates to the field of integrated devices and circuits. The implementation is not limited to a specific technology, and applies to either the invention as an individual component or to inclusion of the present invention within larger systems which may be combined into larger integrated circuits.

2. Brief Description of Related Art

The semiconductor transistor is the most important component for large integrated circuits. In the last three decades, field effect transistors (FETs) used in current integrated circuit process technologies have undergone a continuous shrinking of the semiconductor area needed for elementary components, and new materials including III-V and II-VI semiconductor compounds have been introduced to improve the device performance. However the need to further improve on its general performance while reducing its cost is still a necessity that poses a significant challenge.

In particular, the demand for high bit rate communication, millimeter wave applications and high frequency power conversion requires the development of devices with high cut-off frequencies and low specific $R_{DSon}$ (measured in $\Omega*mm^2$). The silicon area is directly proportional to the cost of the integrated circuit and a low on-resistance is always desirable to increase the efficiency of the circuit and to reduce the power dissipation and therefore the temperature of the chip. Furthermore, a lower specific on-resistance allows the fabrication of devices with smaller gate capacitance and therefore better RF performance.

Two of the main candidates for these applications are High Electron Mobility Transistors (HEMTs) and Metal Semiconductor FETs (MESFETs), using III-V compounds semiconductor materials, such as InAs (Indium Arsenide), GaAs (Gallium Arsenide), AlAs (Aluminum Arsenide) and their alloys (InGaAs and InAlAs) on InP substrate, or III-V Nitride materials such as AlN (Aluminum Nitride), GaN (Gallium Nitride), InN (Indium Nitride) and their alloy (AlGaN, InGaN and InAlN). At the present time, very high cut-off frequencies $f_T$ have been obtained with these devices.

Although more complicated devices with better performance for some applications have been introduced, the MESFET is still the dominant active device for power amplifiers and switching circuits in the microwave spectrum. The MESFET differs from the common insulated gate FET in that there is no insulator under the gate over the active switching region. The gate forms a Schottky contact with the underneath semiconductor layer. This implies that the MESFET gate bias must be limited to low values in order to maintain in inverse mode the Schottky diode formed by the gate with the semiconductor channel, avoiding therefore leaking current through the control terminal. While this restriction inhibits certain circuit possibilities, MESFET analog and digital devices work reasonably well if kept within the confines of design limits, and since the absence of dielectric gate can achieve very high operating frequencies.

High electron mobility transistor (HEMT), also known as heterostructure FET (HFET), is a field effect transistor incorporating a junction between two materials with different bandgaps (i.e., a heterojunction) used as channel instead of a doped region as in MOSFET devices. HEMTs avoid impurity scattering through the use of high mobility electrons generated using the heterojunction of a highly-doped wide-bandgap n-type donor-supply layer (e.g. AlGaAs) and a non-doped narrow-bandgap channel layer with no dopant impurities (e.g. GaAs). The electrons generated in the thin n-type wide-bandgap layer drop completely into the narrow-bandgap layer where are free to move without being affected by impurity scattering. This method to create an electron channel is called modulation doping.

The use of InAs, InAlAs, GaAs and InGaAs materials rather than Si (Silicon) provides two significant advantages. First of all, the room temperature mobility is more than 5 times larger, while the saturation velocity is about twice that of silicon. Second it is possible to fabricate semi-insulating (SI) GaAs substrates which eliminate the problem of absorbing microwave power in the substrate due to free carrier absorption.

Nitride semiconductor is a wide gap semiconductor. For example, GaN (gallium nitride) and AlN (aluminum nitride) exhibit band gaps of 3.4 eV and 6.2 eV, respectively, at ambient temperature. An advantage of nitride semiconductors is that they have a larger insulation breakdown electric field and a greater electron saturation drift speed than compound semiconductor such as GaAs or Si semiconductor. The properties of large band gap materials such as GaN make them ideally suited to operation at elevated temperatures, because they become intrinsic at much higher temperature than narrow band gap materials, and sustain high current or voltage levels, since they exhibit a high breakdown field.

Furthermore, AlGaN/GaN heterostructures do not require modulation doping, which is necessary in GaAs-based devices to create the electron gas at the hetero-interface. Indeed, the discontinuity of the spontaneous polarization, due to the lack of symmetry in wurtzite crystals, induces free carriers at the interface. In addition, the piezoelectric polarization, due to the strain of the AlGaN layer, also plays an important role in increasing the density of carriers in the device channel. High-power operation has been achieved by GaN HEMTs in the millimeter wave frequency range.

In FIG. 1 is depicted a cross-sectional view of a known hetero-structure field effect transistor. In this structure, a Channel narrow-bandgap layer 4, e.g. GaN, and an n-type Barrier layer 6 with a wide bandgap, e.g. AlGaN, are formed in this order over a buffer or substrate layer 5, e.g. sapphire. A source electrode 7 and a drain electrode 3 are formed on the n-type layer 6. Each of the source electrode 7 and the drain electrode 3 can be formed for example with a Ti layer on the n-type layer 6. Highly doped regions can be also added under the source and drain contacts in order to reduce their resistivity. A gate electrode 1 is formed of metallic or semiconductor materials so as to be located between the source electrode 7 and the drain electrode 3. The gate electrode is isolated from the source and drain contacts 7 and 3, through to SiN (Silicon Nitride) regions 8 and 2. This field-effect transistor is usually a normally ON type FET in which a drain current flows when a 0V voltage is applied to the gate, due to the high-concentration two dimensional electron gas generated at the hetero interface between the n-type AlGaN layer 6 and the undoped GaN layer 4.

In order to improve the high-frequency performance, the gate length $L_G$ of the device has to be reduced. The Lg reduction allows the minimization of the parasitic capacitances associated with the device. This condition is essential for the improvement of RF performance. However, the reduction of Lg alone does not lead to maximum RF performance. The so-called "short channel effects" involve a shift of the threshold voltage and a deterioration of the transconductance and of the output conductance.

In order to avoid these effects in HEMT devices, the proper layer design must keep a high aspect ratio Lg/a where a is the distance between the gate electrode and the two-dimensional electron gas. This scaling down rule involves a limit for HEMT structures due to the gate tunnel current and the degradation of the effective gate length related to the depletion in the recessed regions. In MESFET structures instead, the main limitation lays in the gate current leakage which is directly correlated to the channel doping and therefore to the $R_{DSon}$ of the device. In order to increase $f_T$ and $f_{max}$ it is therefore necessary to find alternative solutions based on a rupture of the actual technology.

Another important limitation of these structures is the difficulty to make them operate as enhancement mode device. An interesting solution for this problem has been proposed by Hikita et al. (U.S. Pat. No. 7,816,707), Ueno et al. (U.S. Pat. No. 7,528,423) and Kaibara et al. (U.S. Pat. No. 7,663,161), where the gate region of the transistor has been p-doped in order to raise the device threshold voltage. More in particular, as a potential structure for realizing the normally-off type FET, a HFET structure is proposed in which a p-type GaN layer formed on the top of a barrier layer of AlGaN, is used as a gate for the device. The proposed device includes also a channel layer of undoped GaN under the AlGaN barrier, where the electron channel is formed.

In this structure, the piezoelectric polarization generated at the hetero-interface between the GaN channel layer and the AlGaN barrier layer is canceled by piezoelectric polarization generated at the heterointerface between the AlGaN barrier layer and the GaN control layer. As a result, the concentration of two-dimensional electron gas (2DEG) below the GaN control layer is selectively reduced, thereby achieving the normally-off characteristic.

The solution proposed by Ueno et al., even if very efficient in order to obtain an enhancement mode GaN device, still does not offer an improvement of the carrier transport inside the device, such as an increase of the carrier confinement and/or a decrease of short channel effects. Furthermore, the electron enhancement in the channel portion under the gate is limited (even if an injection of low mobility holes in the channel allows an increase of the electron population).

Several prior art attempts to improve the control on the carrier transport in the device so as to effectively obtaining high RF performance and low on resistance components have been documented. Some of these examples include Takemura (U.S. Pat. No. 6,815,772), Mayer et al. (U.S. Pat. No. 5,497,019), and Hu et al. (U.S. Pat. No. 6,413,802). The general approach in the cited references is to use MOSFET structures, and add more control gate-oxide electrodes to the device in order to obtain a better $I_{on}/I_{off}$ ratio.

All these examples, however, require a much more complex and costly process technology involving usually Silicon On Insulator techniques, which are still very expensive nowadays. A second problem is the alignment of the different gates of the device. Furthermore, since they are built on buried oxide, they cannot be used for power applications, since their capability to dissipate heat is very poor. Silicon dioxide, for example has a thermal conductivity that is about 100 times smaller than the one for Silicon. Finally, their solution is limited to Metal-Oxide-Silicon devices, where a dielectric layer is placed between the gate electrode and the channel, increasing the gate capacitance with respect to HEMT and MESFET devices, decreasing the RF performance of the device.

Another interesting prior art attempt to achieve higher carrier confinement in HEMT devices has been proposed by Nikaido et al. (U.S. Pat. No. 5,473,175), where a double channel HEMT has been obtained utilizing multi-heterojunction layer stacks, each including a carrier supply layer and a carrier transport layer to thereby form a plurality of hetero junctions so as to generate 2DEG layers in heteroboundary-regions on side portions respectively of the carrier transport layers.

The solution proposed by Nikaido et al. improves the carrier confinement in the channel and therefore the performance of the device at high frequency. However, also this structure has its limitations, since it does not increase the control on the carrier transport. The gate modulates the second channel only after it has depleted the first one. The device transconductance is not higher with respect to standard HEMT transistors.

There is therefore a need for a new device structure which has an improved carriers confinement in the channel and an improved control on the carrier transport so as to effectively obtain a better $I_{on}/I_{off}$ ratio and a higher transconductance. The fabrication of the new device should not utilize expensive SOI fabrication process techniques and should not be limited to silicon semiconductor materials. The new transistor should have a low parasitic gate capacitance and therefore it should not include MOS structures. Furthermore, the new structure should be suitable to obtain both enhancement and depletion mode devices.

Although the cited prior art references describe structures that offer some of the described advantages, no one of them includes all of them, limiting their ability to solve the problem of obtaining transistors with high RF performance, and low on resistance per given semiconductor area in the IC contest.

It is therefore a purpose of the present invention to describe a novel structure of a semiconductor transistor that offers the advantage of much higher density, reducing semiconductor area and cost combined with improved performances in terms of on resistance and frequency response.

SUMMARY OF THE INVENTION

The present invention describes a transistor based on a FET structure, where multiple channels and multiple gate regions are formed in order to achieve a lower specific on-resistance, and a higher control on the transport properties of the device. No dielectric layer is present between gate electrodes and device channels, decreasing the parasitic capacitance associated with the gate terminal. The fabrication of the device does not involve Silicon On Insulator techniques and it is not limited to Silicon semiconductor materials. It can be fabricated as an enhancement or depletion device with much more control on the device threshold voltage, and with superior RF performance.

In order to better understand this concept, let us consider the structure illustrated in FIG. 2, which represents the preferred embodiments of the invention in HFET technology. As it can be seen, conventional device regions (source, gate and drain) are present. However, besides the first barrier layer 17 and the first gate 9, a second barrier layer 12 and a second semiconductor gate region 14 have been added to the structure. Two side barrier layers 16 and 13, made with the same or a different material than the gate region 14, have also been formed to delimit the second gate.

If the device is used as n-channel FET, both barrier layers 17 and 12 have a lower electron affinity with respect to the channel layer 10 whereas, the two gate regions 9 and 14 can be either with higher or lower electron affinity with respect to the channel layer depending on the materials involved in the device fabrication. The source and the drain regions 18 and 11 can be formed with highly doped semiconductor or metallic materials, and they may or may not extend down to the second barrier layer. Many variants for the source and drain regions design exist, for example they can be placed directly above the first barrier layer, and doped regions comprising the barrier layer can be made in order to decrease the contact resistance. In any case, due to the double channel approach, the contacts resistance is much lower than in the conventional structure illustrated in FIG. 1.

The second barrier layer 12 added to the structure increases the confinement of the carriers in the channel reducing the short channel effects. The second gate 14 is highly doped and is used to increase the control on the carrier transport of the device. The fact that the second gate is formed utilizing semiconductor materials has incredible advantages since it allows the formation of the second barrier layer directly on the top of it with limited lattice mismatch, process that would be impossible if the second gate was formed with metallic materials or if a dielectric layer was required between the channel layer and the second gate. This is an extremely important characteristic since it allows the fabrication of the device without expensive SOI techniques. Furthermore, the parasitic capacitance associated with the gate terminal is lower with respect MOS systems due to the absence of gate-dielectric layers.

If the gate regions 9 and 14, and the barrier layers 12 and 17 are properly doped, the device can behave as an enhancement or depletion mode device, with all the advantages described above and with one extra degree of freedom in the choice of the threshold voltage, since the threshold voltage is influenced also by the thickness of the channel layer.

If the channel region 10 is formed thin enough, the two channels at the upper and lower interface can also merge in a single electron (or hole)-channel, further increasing the control on the carrier transport. The $R_{DSon}$ of the device is much lower due to the enhanced current drive derived from the double channel configuration. Furthermore, if necessary, one or both the gate layers 9 and 14 can be divided in more layers of different materials in order to improve the device performance.

FIG. 3 shows a second embodiment of the present invention built in FINFET configuration. As it can be seen, in this embodiment, the second gate is connected on the lateral sides of the device minimizing the parasitic capacitance and resistance associated with the gate terminal. The two gates can be short-circuited together or biased differently one from the other depending on the application.

In FIG. 4 is depicted an implementation example of the embodiments described above, where an InGaAs/InAlAs Double Gate HFET is shown. In this case, the two barrier layers 33 and 41 are made of intrinsic InAlAs and the two gate regions 35 and 42 are made in heavily doped InGaAs or InAlAs semiconductor. In order to supply carriers to the channel, two δ doping implants 37 and 31 have been formed in the two barrier layers.

FIG. 5 shows a cross section of the device of FIG. 4. When the two gate regions are kept at low voltage, the electrons created by the δ doping implants in the InAlAs layers, drop in the InGaAs quantum well forming a conductive path between the source 55 and the drain 46. Vice versa, when the gate voltage overcomes the threshold voltage of the device, the two electron channels at the InGaAs/InAlAs hetero-interfaces deplete, interrupting the conduction path between the source and drain.

Obviously many doping profiles and layers can be added to the structure in order to improve the device design and the channel density. Other techniques include the use of δ doping implants not overlapping with the gate regions in order to increase the device threshold voltage. An example of this last approach is shown in FIG. 6, where the δ doping implants have been placed laterally to the gate regions.

Another interesting example of implementation of the embodiment of FIG. 3 is illustrated in FIG. 7, where the two barrier layers 74 and 81 are made in intrinsic AlGaN or AlN semiconductor material. The first gate region 71 has been formed with heavily p-doped GaN grown on the top of a heavily p-doped AlGaN layer 82. A n-doped layer 73 has been added between the GaN channel 78 and the second barrier layer 74, in order to compensate the polarization at the lower channel interface.

The function of the extra GaN layer 71 is to compensate the polarization at the channel interface under the upper gate and to increase the device threshold voltage. The p+ AlGaN is instead used to inject low mobility holes in the channel for high enough gate voltages, in order to attract more electrons under the gate. The p+-AlGaN layer can be extended also from the drain to the source of the device (without entering into contact with it) in order to decrease the current collapse effects.

FIG. 8 shows a cross section of the device of FIG. 7. Obviously many doping profiles (also with δ doping) and extra layers can be used in order to improve the device design and the channel density. For example, the two layers 84 and 85 can be replaced with a single layer formed in GaN, AlGaN, or AlN material. Furthermore, if the layer 89 is formed with doped AlGaN or AlN, the barrier layer 90 can be removed, and layer 89 can be used directly as a barrier layer. Other techniques include the use of graduated molar fraction layers to engineer the lower channel interface. Both Ga-Face and N-Face technologies can be used by simply adapting the same structure concept.

FIG. 9 shows another implementation example of the present invention, where the extra layer 89 of FIG. 8 has been removed and the doping of the side barrier layers 104 and 107 has been used to compensate the polarization at the lower channel interface. In this case however, particularly attention must be paid in order to avoid the short-circuit between the gate and two side layers. The material used for the gate 105 should therefore have a lower electron affinity with respect to the side barrier layers 104 and 107.

In this particular case, the N-face configuration can be very useful since will reverse all the polarization in the device. In the N-face configuration, an upside-down structure with respect to the one shown in FIG. 9 can be used, allowing an isolation of the gate with a thin dielectric layer deposited on its sides. Many other solutions are also possible as illustrated in FIG. 10.

As shown in FIG. 11, multichannel structures can be also obtained applying the base concept of the present invention. In this case the on-resistance of the device is very low. However, increasing the number of conductive channels raises the cost and reduces the reliability of the fabrication process. This embodiment will be cost effective only in limited and specific applications.

For all the implementation examples discussed above, the considerations done previously for the source and drain regions of the embodiment of FIG. 2, are still valid. The source and the drain regions can be formed with highly doped semiconductor or metallic materials, and they may or may not extend down to the second barrier layer. They can be placed directly above the first barrier layer, and doped regions comprising the barrier layer can be made in order to decrease the contact resistance. As well known to anyone skilled in the art many other variants exist.

In FIG. 12 another interesting embodiment of the present invention is depicted, where the source 151 and drain 143 have been auto aligned with the first gate 153. These two regions can be formed with highly doped semiconductors or using metallic materials. In this second case the regions 144, 146,148 and 149 under the source and drain regions can be formed using dielectric materials in order to better isolate the device terminals from the second gate 147.

By adopting simple modifications, all the structures illustrated above can be realized also using a JFET configuration. An example of JFET device, according to the present invention, is shown in FIG. 13, where the source and drain regions have been isolated from the second gate through the regions 161 and 156. In this case the device can be fabricated also using silicon semiconductor materials.

Aside the stack configurations illustrated above, the present inventions can be realized also with a lateral gate configuration as illustrated in FIG. 14, or a triple gate configuration as shown in FIG. 15. In FIG. 14 the laterals gates 177 and 174 can be also fabricated using Schottky contacts, in this case the two barrier layers 173 and 176 can be removed or can be highly p-doped in order to increase the Schottky barrier (similar considerations hold for the structure reported in FIG. 15). Furthermore, the device can be formed using silicon semiconductor material.

FIG. 16 shows a variant of the triple gate structure discussed above, where the transistor has been designed to work as a JFET or MESFET device. Also in this case, the device can be formed using silicon semiconductor material, and the p+ layer can be obtained depositing a p+ doped poly-silicon layer, on the top of the channel. The contacts can be auto-aligned or not with the gate, depending on the materials used to form the source and drain regions.

FIG. 17 shows how to obtain a gate-all-around structure utilizing a HFET configuration. For sake of clarity, FIG. 18 illustrates a cross-section view perpendicular to the carrier transport for the device shown in FIG. 17. As it can be seen, a gate region 202 and a barrier layer 203 surround the device channel 206, optimizing the control on the carrier transport.

FIG. 19 is depicting the JFET version of the gate-all-around structure discussed above. Also in this case, the contacts may or may not be auto-aligned with the gate, depending on the materials used to form the source and drain regions.

For all the structures described above, the semiconductor fin can also have a trapezoidal shape, in order to simplify the fabrication process. An example, is shown in FIG. 20, where a trapezoidal triple-gate FET device is illustrated. Also a dual gate version can be obtained for all the embodiments. An example of dual gate structure is illustrated in FIG. 21, where a second gate terminal has been added to a triple-gate FET device.

For all the FET structures discussed above, the p-channel version can be obtained. Furthermore, the hetero junction based structures can be realized with standard HFET fabrication process. In particular, for the structure of FIG. 2-12, the two (or more) extra layers are deposited and, if necessary, doped at the beginning of the process in order to create the additional FET structure under the original device.

The devices structures shown in FIGS. 13,14,16,19, and 20,21 (when realized in JFET or MESFET configurations), can be fabricated also in standard silicon CMOS technology. By means of a simple silicon etching step at the beginning of the CMOS process, the semiconductor FIN can be formed on the substrate surface. This makes the present invention very cost effective.

As mentioned above, the materials used in the fabrication process of the previous structures can comprise any type of semiconductor materials, including II-VI compound semiconductors, polar (such as GaN; AlN, InN etc. and their alloys) and non polar (such as GaAs, AlAs, InAs etc. and their alloys) materials, and/or in some case Silicon, sapphire, SiC etc. In the case where polar materials such as III-Nitride materials are used, particularly attention must be paid to the molar fraction and the doping profiles used in the different layers forming the device. Extra layers can be also added to the structure in order to improve the device performance.

It is therefore an object of the present invention to increase the packing density by increasing the on-resistance of the device and the control on the device transport, reducing at the same time the parasitic capacitance associated to the gate terminal of the device.

As is clear to those skilled in the art, this basic system can be implemented in many specific ways, and the above descriptions are not meant to designate a specific implementation.

BRIEF DESCRIPTIONS OF THE DRAWINGS

The features, objects, and advantages of the present invention will become apparent upon consideration of the following detailed description of the invention when read in conjunction with the drawings in which.

DETAILED DESCRIPTION OF SPECIFIC EMBODIMENTS

A FIG. 2

Figure 1:
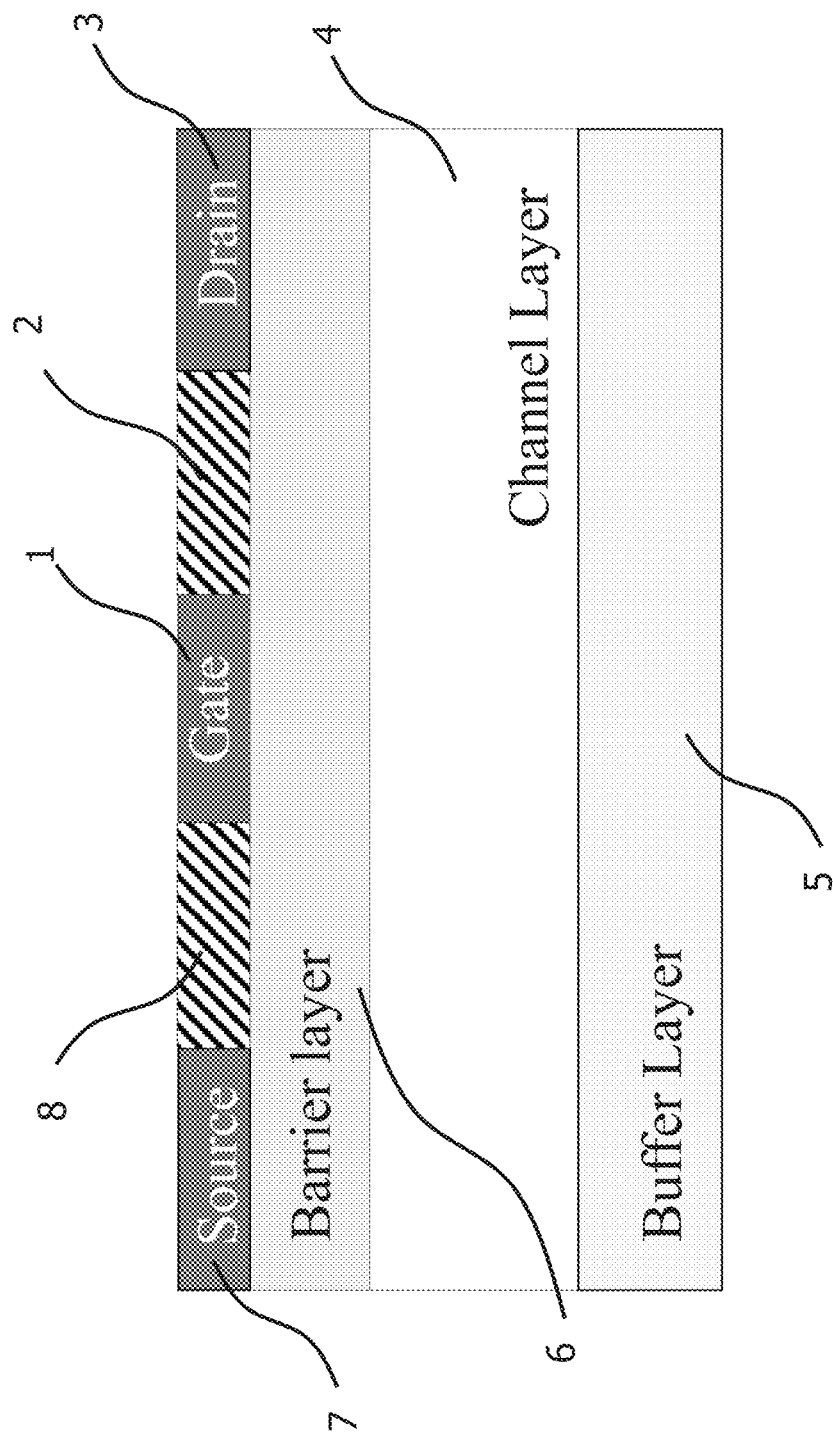
FIG. 1 shows a cross section view of a conventional HFET device (prior art).
Figure 2:
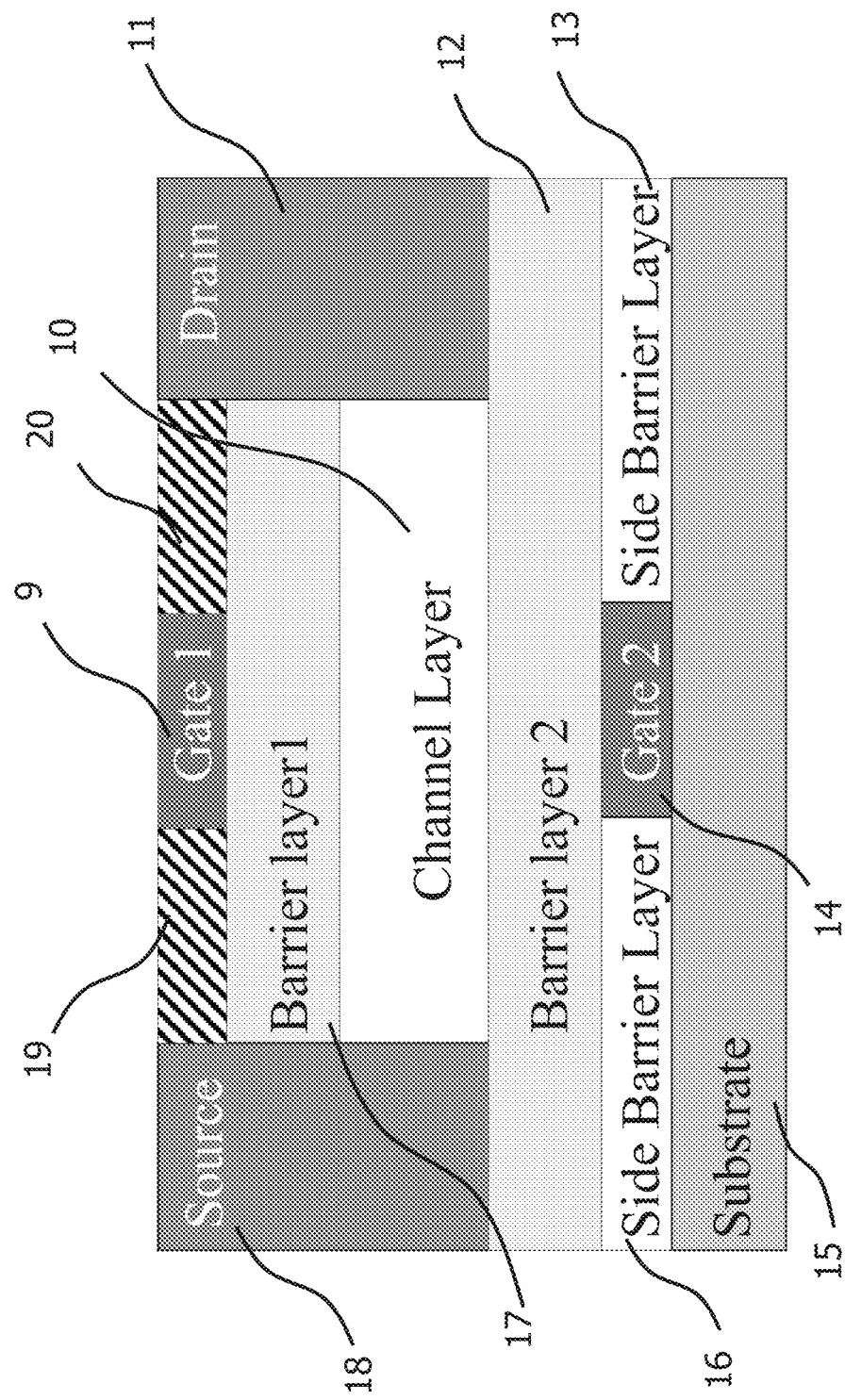
FIG. 2 shows a cross section view of a double gate HFET device according to the preferred embodiment of the invention.

FIG. 2 is showing a Double Gate HFET (DGHFET) device according to the preferred embodiment of the invention. The metallic or n+-type semiconductor regions 11 and 18 define the drain and the source of the transistor. Regions 17 and 12 corresponds to the two barrier layers of the device, and the channel layer 10 is the region where the electron (or hole)-channels are formed. Region 9, which can be formed using semiconductor materials or metal, corresponds to the first gate of the device, whereas the semiconductor region 14 corresponds to the second gate. As it can be seen, differently from the conventional structure of FIG. 1, where only one electron (or hole)-channel can be identified, in this embodiment a second conductive channel and a second modulation gate have been added to the structure.

If the desired device is an n-channel HFET, the channel region should have an electron affinity greater with respect to the two barrier layers 17 and 12, in order to confine the carrier transport inside region 10 during the normal operation of the device. The gate regions 9 and 14 instead, can be built with the same or greater electron affinity with respect to the barrier layers, depending on the materials used to fabricate the device. If necessary, one or both the gate layers 9 and 14 can be divided in more stacked layers of different materials.

The source and drain regions 11 and 18 may or may not extend down to the lower barrier as shown in FIG. 2. Furthermore, they can be also formed above the first barrier layer instead of extending down into the channel as illustrated in figure. Obviously the last solution, even if easier with respect to the illustrated one from a process view point, increases the contacts resistance in the device. The structure is build on top of a buffer or substrate layer 15. Regions 19 and 20 isolate the gate region 9 from the source and drain terminals 18 and 11. If desired the source and drain terminals 18 and 11 can be also formed auto-aligned with one or both gate regions 9 and 14.

The present invention defines a HFET device with a multiple-gate structure which does not include MOS systems, neither require expensive SOI technologies, which leads to a significant reduction of both gate capacitance and fabrication costs. Furthermore, since the drain and the source regions are placed directly in contact with the two channels, the parasitic resistances associated with these contacts are significantly reduced. Finally, the double channel configuration reduces the current collapse effects.

The multi-gate configuration allows the reduction of the surface roughness and impurity scattering, and increases the number of conductive channels, leading to an increase of the conductivity in the device during on-state conditions. The thickness of the channel region 10 can be chosen in order to optimize the control on the carrier transport in the device, and its threshold voltage.

By varying the materials of the different layers and/or their doping, the present invention can be realized as enhancement or depletion devices with higher control on the threshold voltage of the device with respect to prior art enhancement devices. Furthermore, because of the absence of gate-dielectric-layers, superior RF performance can be obtained. More explicit examples on how to implement this embodiment are described below in the following figures.

Starting from the base concept structure of FIG. 2, an unlimited number of modifications can be adopted depending on the materials used, in order to optimize the device performance. Supply carrier layers and/or barrier layers can be added to the device.

B FIG. 3

Figure 3:
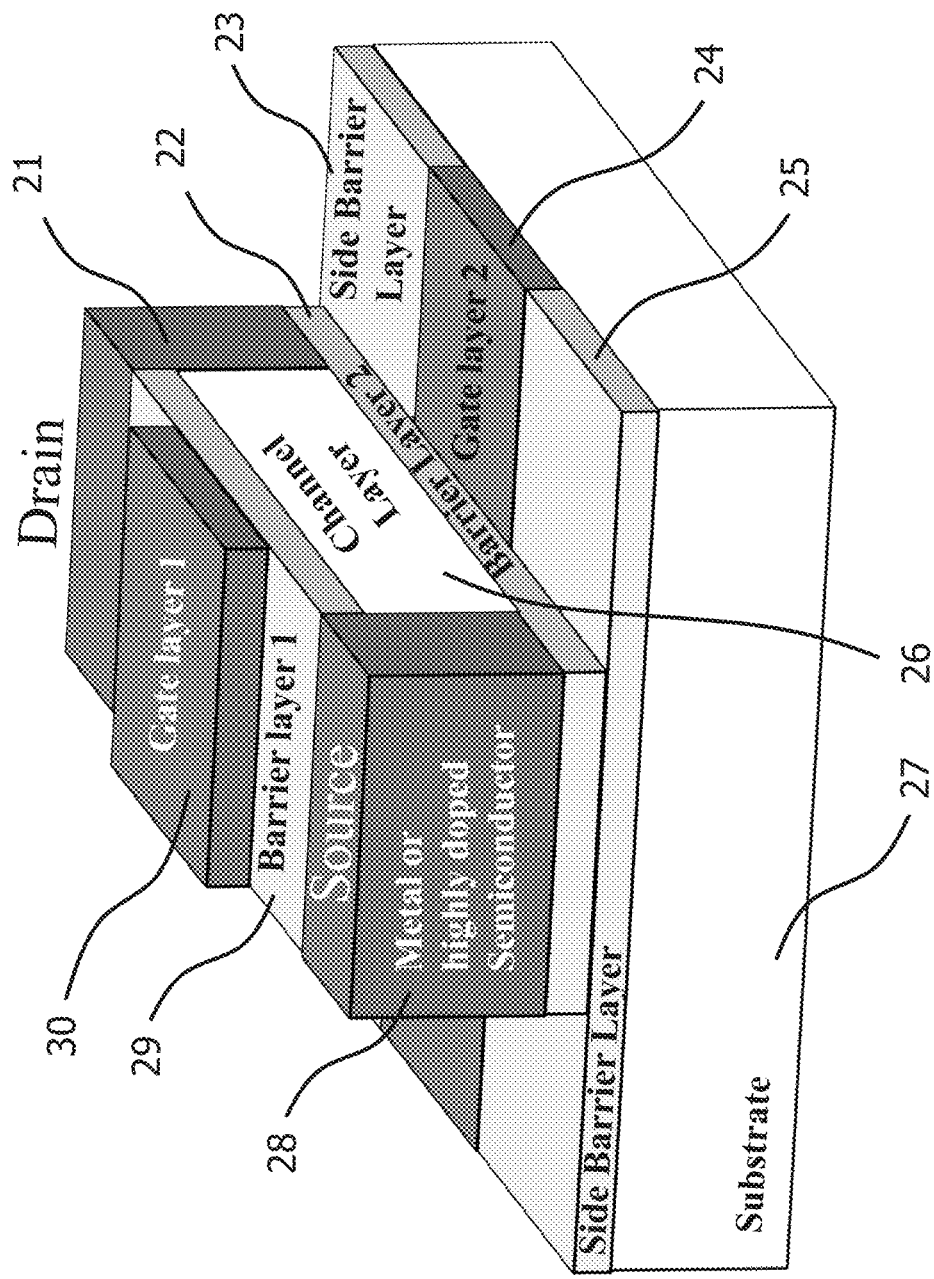
FIG. 3 shows a second embodiment of the invention in FINFET configuration.

FIG. 3 is depicting a 3-dimensional view of a DGHFET structure according to a second embodiment of the invention. This structure has the cross section of FIG. 2 and is formed using a FIN semiconductor structure. The gate contacts for the lower gate are placed on the sides of the device in order to minimize the gate resistance and parasitic capacitance. Another solution could be to contact the second gate at the left of the source or at the right of the drain (with respect to the cross-section view of FIG. 2), however in this case the device performance can be seriously degraded. This last configuration should be therefore used only when the second gate is biased independently from the first one and is maintained at a fixed voltage. The described structure allows a simple implementation of the present invention, guaranteeing high performance to the device. The structure is build on top of a buffer or substrate layer 27. Regions 21 and 28 are the drain and the source of the device. Region 29 and 22 are the upper and lower barrier layers, respectively. Regions 23 and 25 are the side barriers of the second gate region 24. Region 30 is the upper gate of the device whereas, region 26 is the channel region.

C FIG. 4

Figure 4:
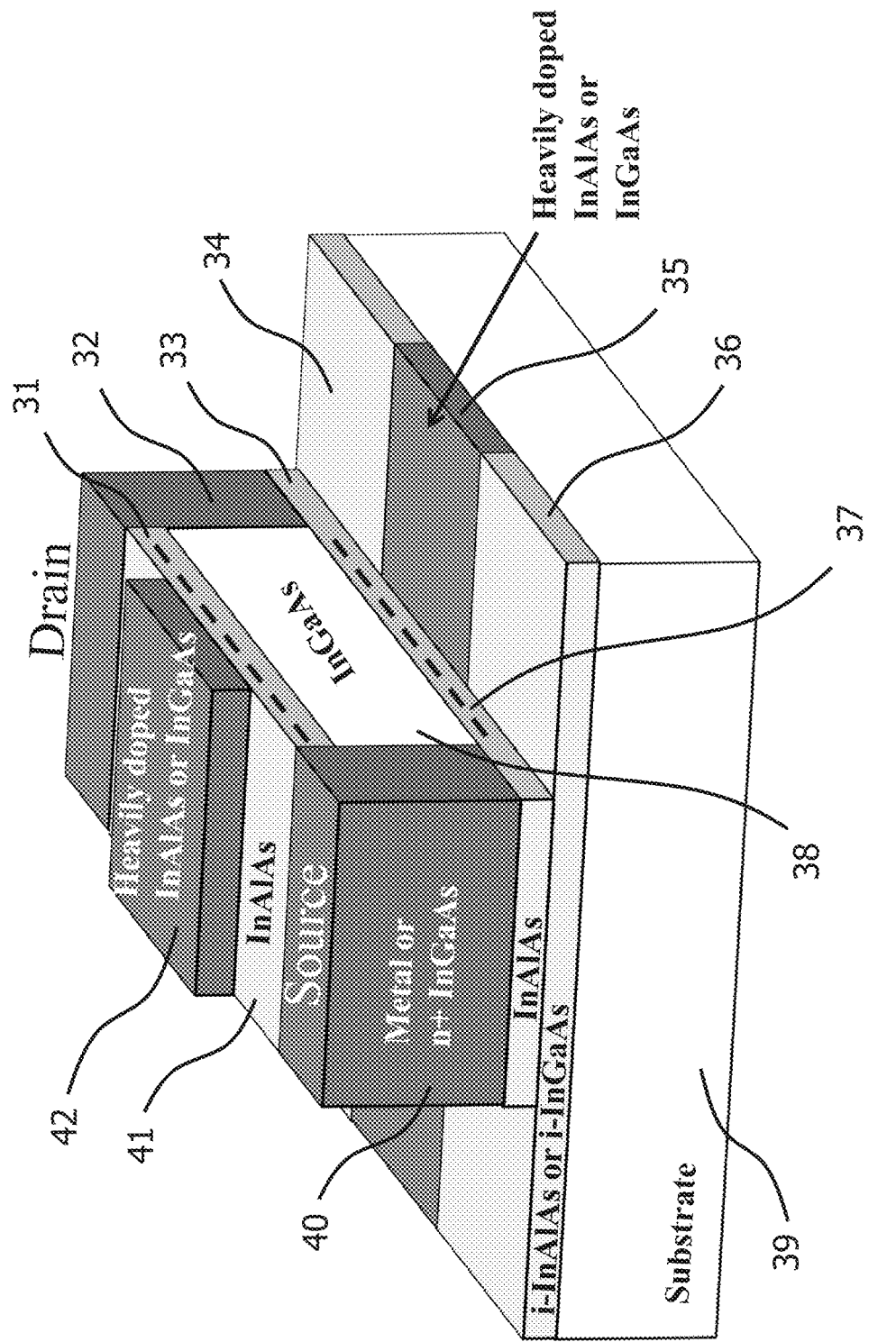
FIG. 4 shows an InGaAs Double Gate Hetero-structure device according to a first implementation of the second embodiment of the invention.

FIG. 4 is depicting a possible implementation of the embodiment of FIG. 3 using InGaAs and AlGaAs III-V compounds materials. In this case, the two barrier layers 33 and 41 are made in intrinsic InAlAs and the two gate regions 35 and 42 are formed using heavily doped InGaAs or InAlAs. In order to supply carriers to the channel, two δ doping implants 37 and 31 have been added to the two barrier layers. In the case where the device should have a positive threshold voltage a p-doping type can be used for the gate regions. Layer 39 represents the substrate or buffer. Regions 32 and 40 are the drain and the source of the device, and can be made of a metallic material or a highly doped semiconductor material. Region 41 and 33 are the upper and lower barrier layers, respectively. Regions 34 and 36 are the side barriers of the second gate region 35. Region 38 is the channel region of the device.

D FIG. 5

Figure 5:
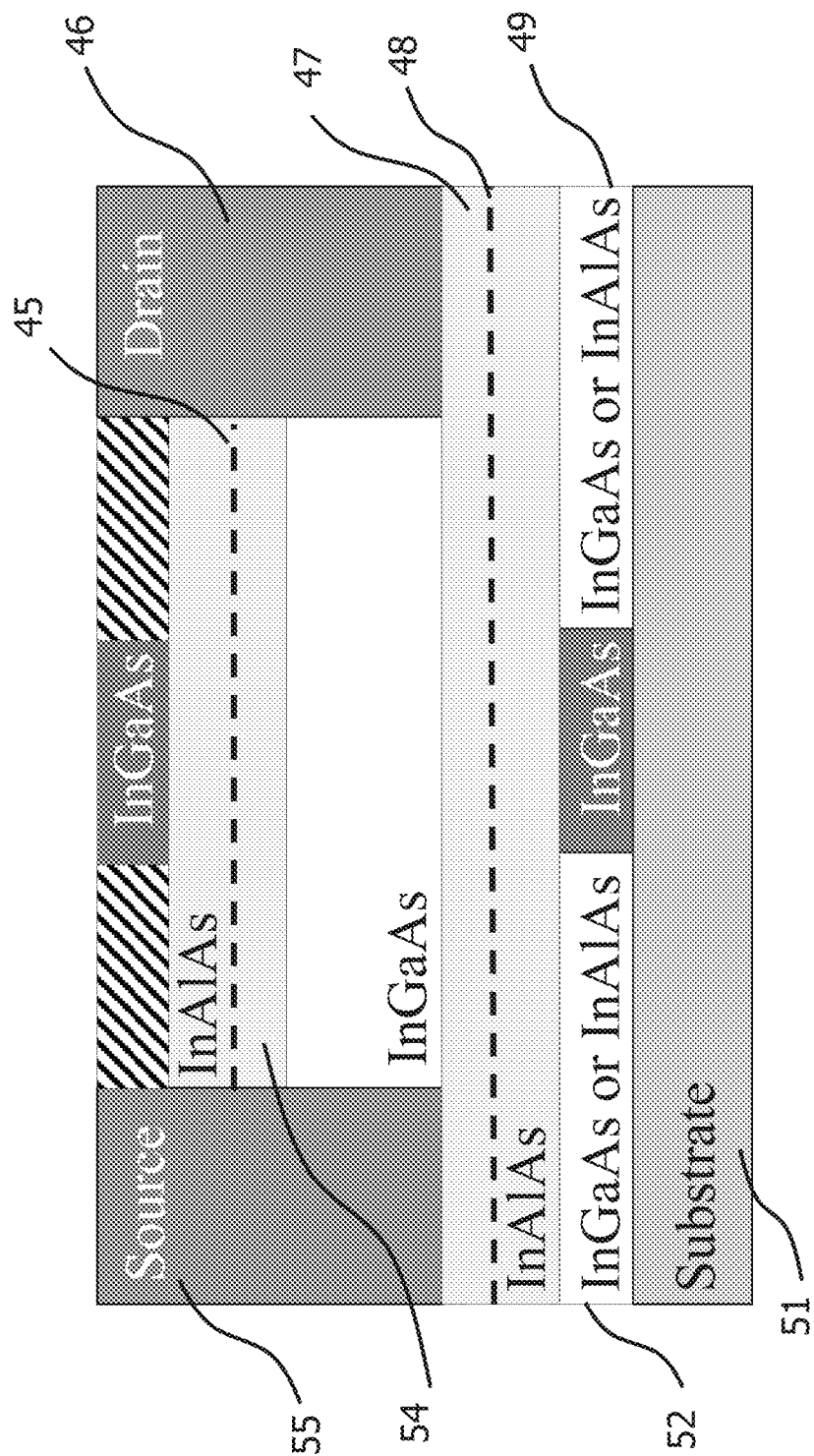
FIG. 5 shows a cross section view of the InGaAs Double Gate Hetero-structure device of FIG. 4.

In FIG. 5 a cross section view of the implementation of FIG. 4 is shown. As well known to anyone skilled in the art many doping profiles and layers can be added in order to improve the device design and the channel density. The side layers 49 and 52 can be done in intrinsic InAlAs as illustrated in figure, or in InGaAs. They can be also doped to supply electrons to the channel. The substrate layer 51 can be for example semi-insulating GaAs. Regions 46 and 55 are the drain and the source of the device, and can be made of a metallic material or a highly doped semiconductor material. If desired, two delta-doping implantations 45 and 48 can be added to the two barrier layers in order to supply carriers to the channel.

E FIG. 6

Figure 6:
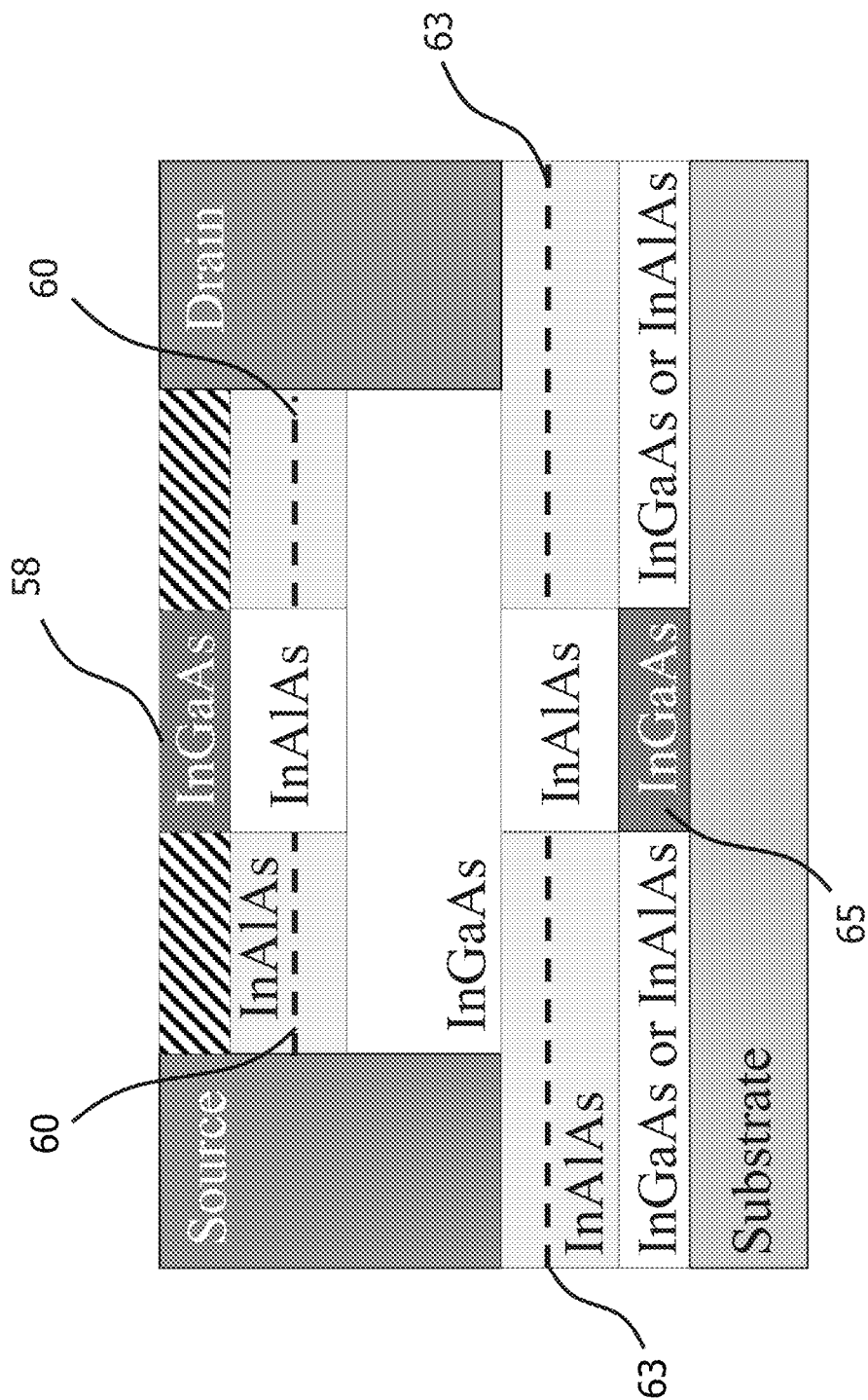
FIG. 6 shows a cross section view of an InGaAs Double Gate Hetero-structure device according to a second implementation of the second embodiment of the invention.

Starting from the basic principle of FIGS. 4 and 5, an unlimited number of variations can be obtained. Other techniques can be adopted, including the use of δ doping implants not overlapped with the gate in order to increase the threshold of the device as shown in FIG. 6, where a second implementation of the present invention is shown. In this structure the δ doping implants 60 and 63 are formed laterally to the gates avoiding an accumulation of channel carriers in correspondence of the control terminals when the gates voltage is set at 0V.

In this implementation, the gate regions 58 and 65 can be formed using p+ or n+ doped InGaAs or InAlAs layers, depending on the desired value for the threshold voltage. By using $p^+$-doped semiconductor the threshold voltage will be higher, whereas if a $n^+$-doping type is used the resulting threshold voltage is lower.

F FIG. 7

Figure 7:
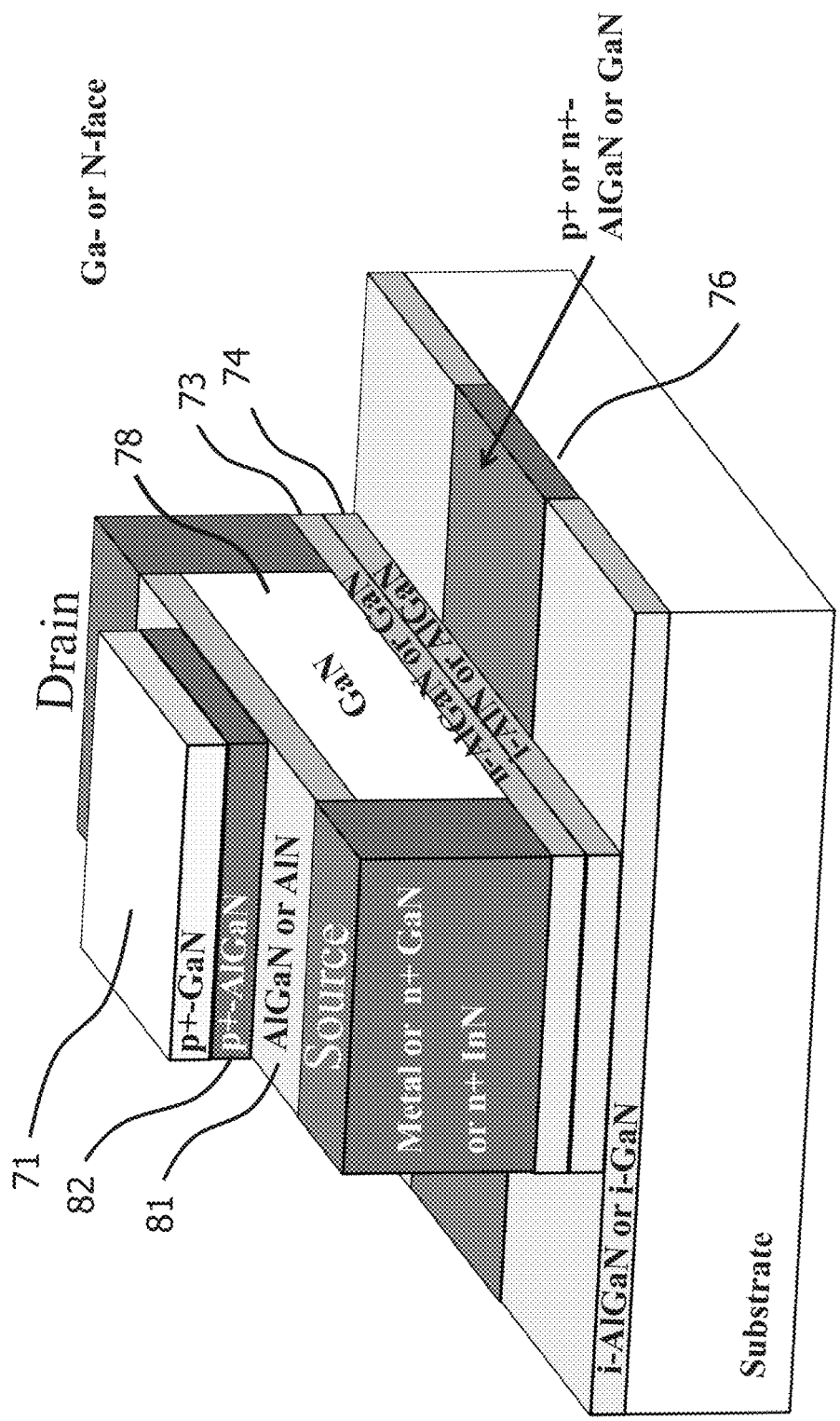
FIG. 7 shows a GaN Double Gate Hetero junction device according to a third implementation of the second embodiment of the invention.

In FIG. 7 another implementation of the embodiment of FIG. 3 is depicted, where polar materials such as AlN, GaN and AlGaN are utilized. As it can be seen, in this case an additional layer 73 has been added on the top of the lower barrier 74 in order to supply carriers to the lower channel and to compensate the polarization at the lower interface.

The device consists from top to bottom of a GaN layer 71 formed above an AlGaN layer 82, both highly doped with Mg implantations in order to obtain an enhancement mode device, deposited on an AlN or AlGaN barrier layer 81, which confines the carriers in the GaN channel layer 78 formed under it. The extra GaN layer 71 has the function to decrease the polarization charge at the channel surface under the first gate. The GaN channel 78 is formed above a n-doped layer 73 and a second barrier layer 74. A second GaN or AlGaN highly doped gate region 76 has been formed under the second barrier layer 74.

G FIG. 8

Figure 8:
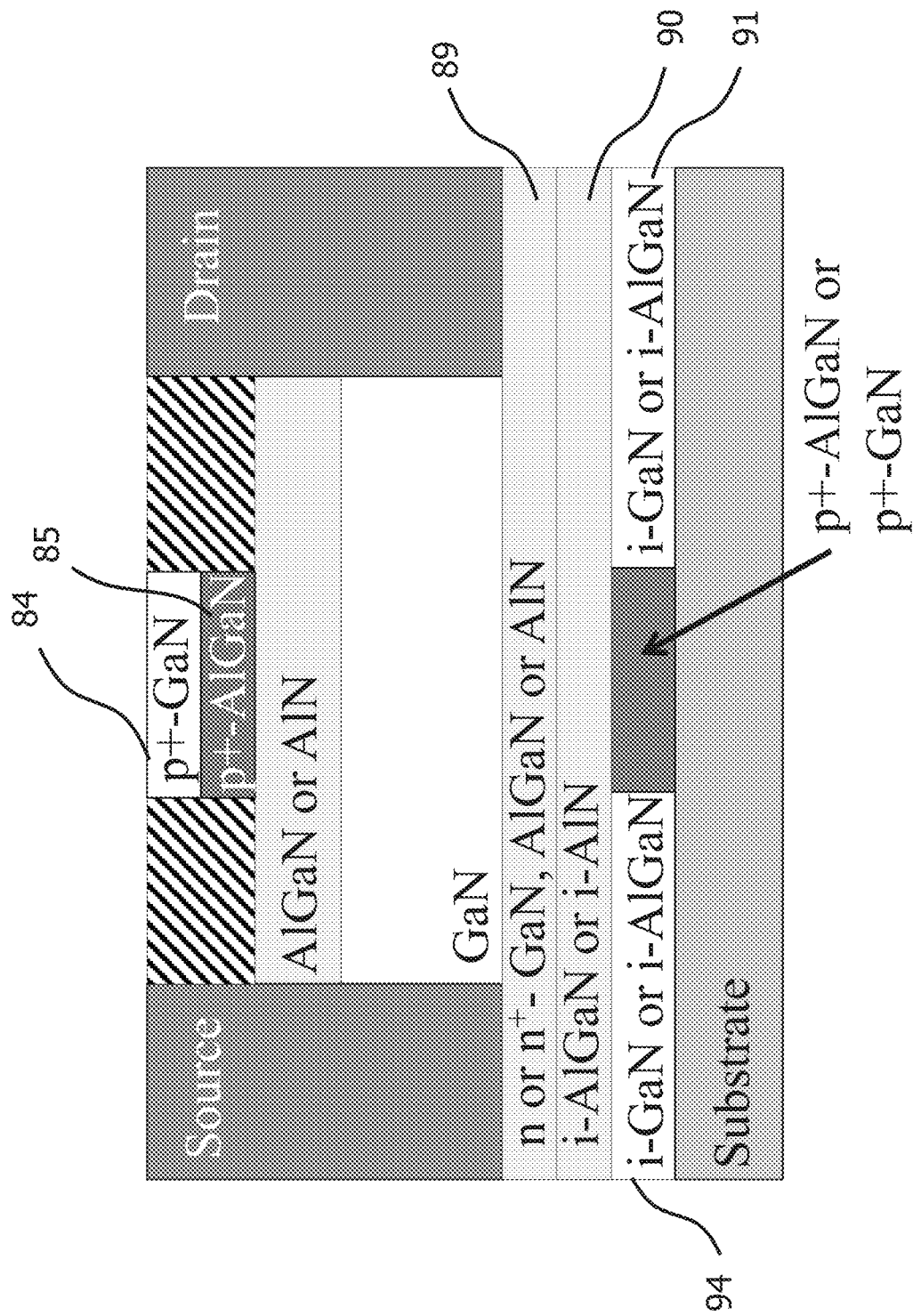
FIG. 8 shows a cross section view of the GaN Double Gate Hetero-structure device of FIG. 7.

In FIG. 8 a cross section view of the implementation shown in FIG. 7 is depicted. Also in this case many doping profiles and layers can be added to the structure in order to improve the device performance and decrease its on-resistance. The p+-AlGaN layer can be also extended from the drain to the source of the device (without entering in contact with them) in order to decrease the current collapse effects. The side layers 91 and 94 or the second barrier 90 itself can be doped to supply carriers to the channel. In this case the extra layer 89 can be removed.

H FIG. 9

Figure 9:
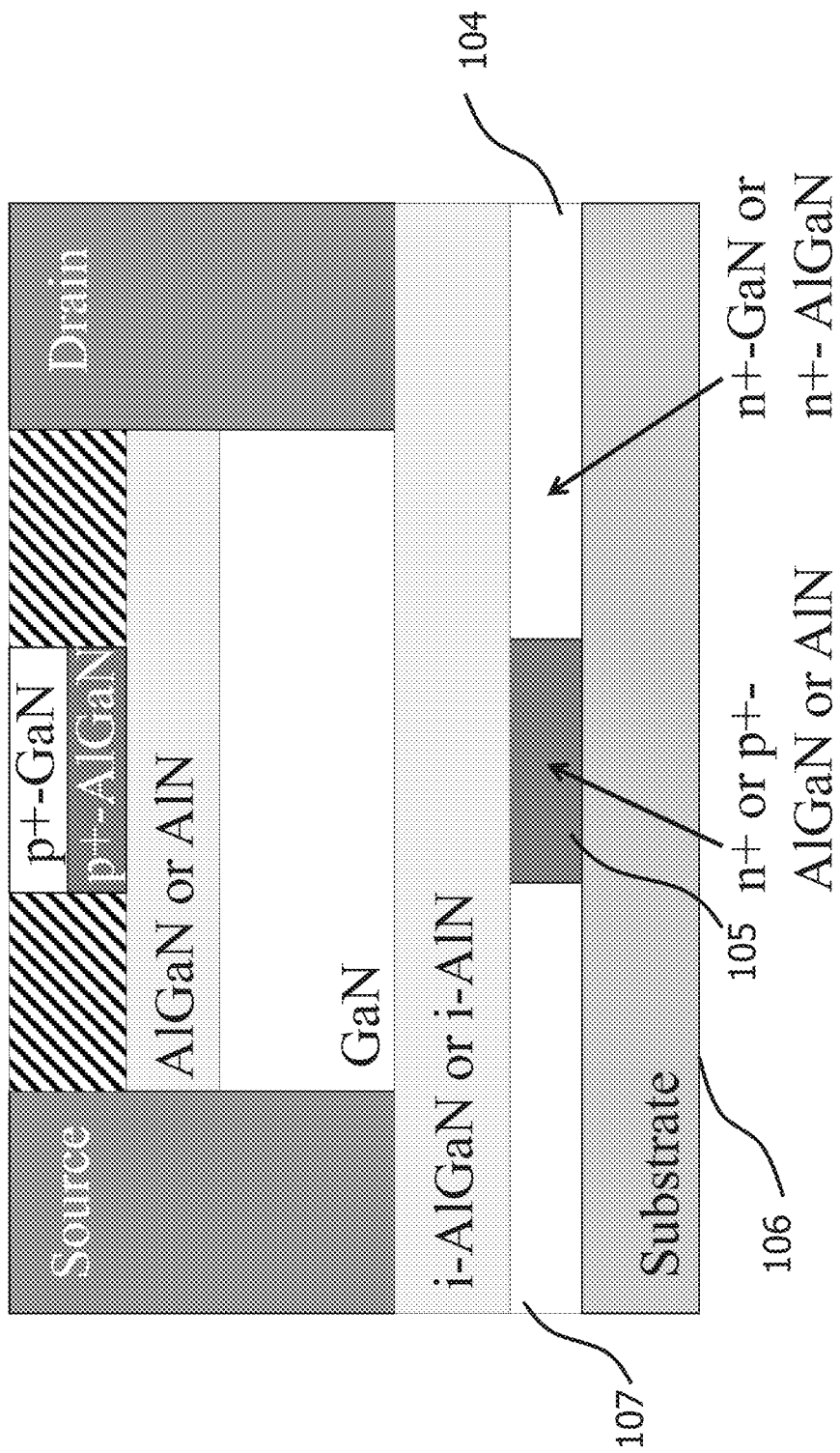
FIG. 9 shows a cross section view of a GaN Double Gate Hetero-structure device according to a fourth implementation of the second embodiment of the invention.

Starting from the basic principle of the structures shown in FIGS. 7 and 8, an unlimited number of variants can be obtained. For example, in FIG. 9 the extra layer 89 of FIG. 8 has been removed and the doping of the side barrier layers 104 and 107 has been used to compensate the polarization at the lower channel interface. In this case however, particular attention must be paid in order to avoid the short-circuit between the gate and the source/drain terminals. The material used for the gate region 105 should therefore have a lower electron affinity with respect to the side barrier layers 104 and 107. In this particular case, the N-face configuration can be very useful since reversing all the polarization the device structure can be formed upside-down with respect to the illustrated one, allowing an isolation of the gate with a simple dielectric layer deposited on its sides. Layer 106 represents the buffer or substrate layer.

I FIG. 10

Figure 10:
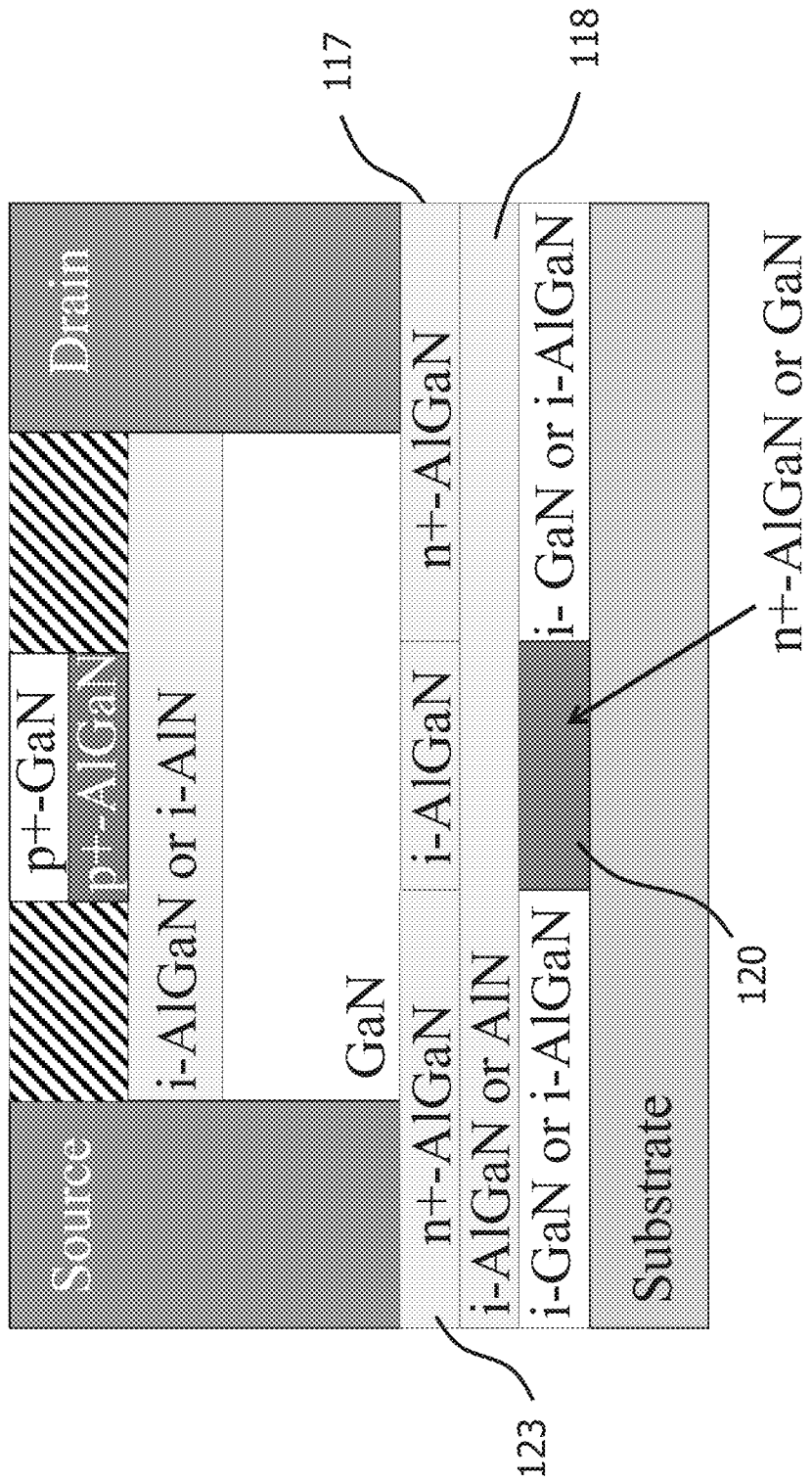
FIG. 10 shows a cross section view of a GaN Double Gate Hetero-structure device according to a fifth implementation of the second embodiment of the invention.

As illustrated in FIG. 10, where a DGHFET device according to another possible implementation of the embodiment of FIG. 2 is shown, many other solutions are possible. In this structure, the extra layer above the second barrier layer 118, has been heavily n-doped only in the regions 117 and 123, not overlapping with the gate region 120.

For all the implementation examples discussed above, the considerations done previously for the source and drain regions of the embodiment of FIG. 2, are still valid. The source and the drain regions can be formed with highly doped semiconductor or metallic materials, and they may or may not extend down to the second barrier layer. They can be placed directly above the first barrier layer, and doped regions comprising the barrier layer can be created in order to decrease the contact resistance. Many other variants exist.

J FIG. 11

Figure 11:
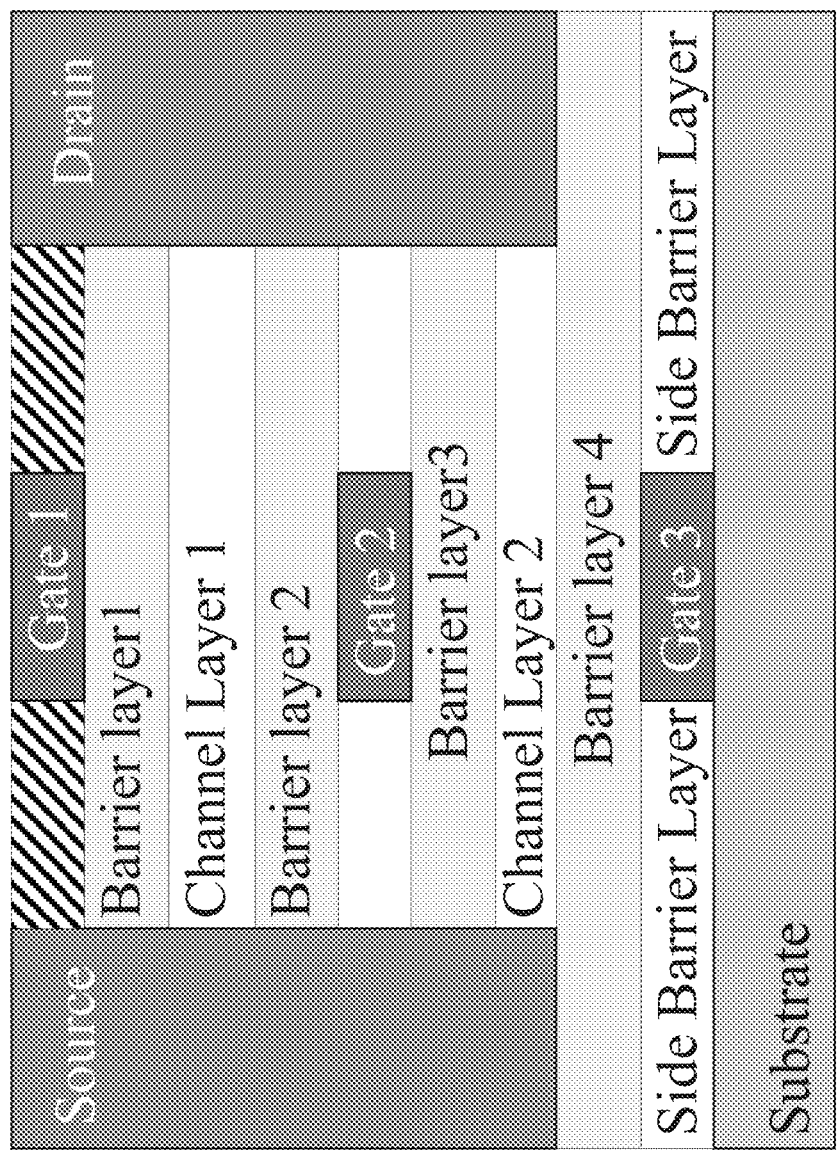
FIG. 11 shows a cross section view of a Multiple Channel Hetero-structure device according to a third embodiment of the invention.

As shown in FIG. 11, multi-channel structures can be obtained applying the base concept of the present invention. In this case the device on-resistance can achieve extremely low values. However, increasing the number of channels, raises the cost and reduces the reliability of the fabrication process. This feature makes the embodiment of FIG. 11 suitable for only some specific applications, where an extremely low on-resistance is the most important parameter.

K FIG. 12

Figure 12:
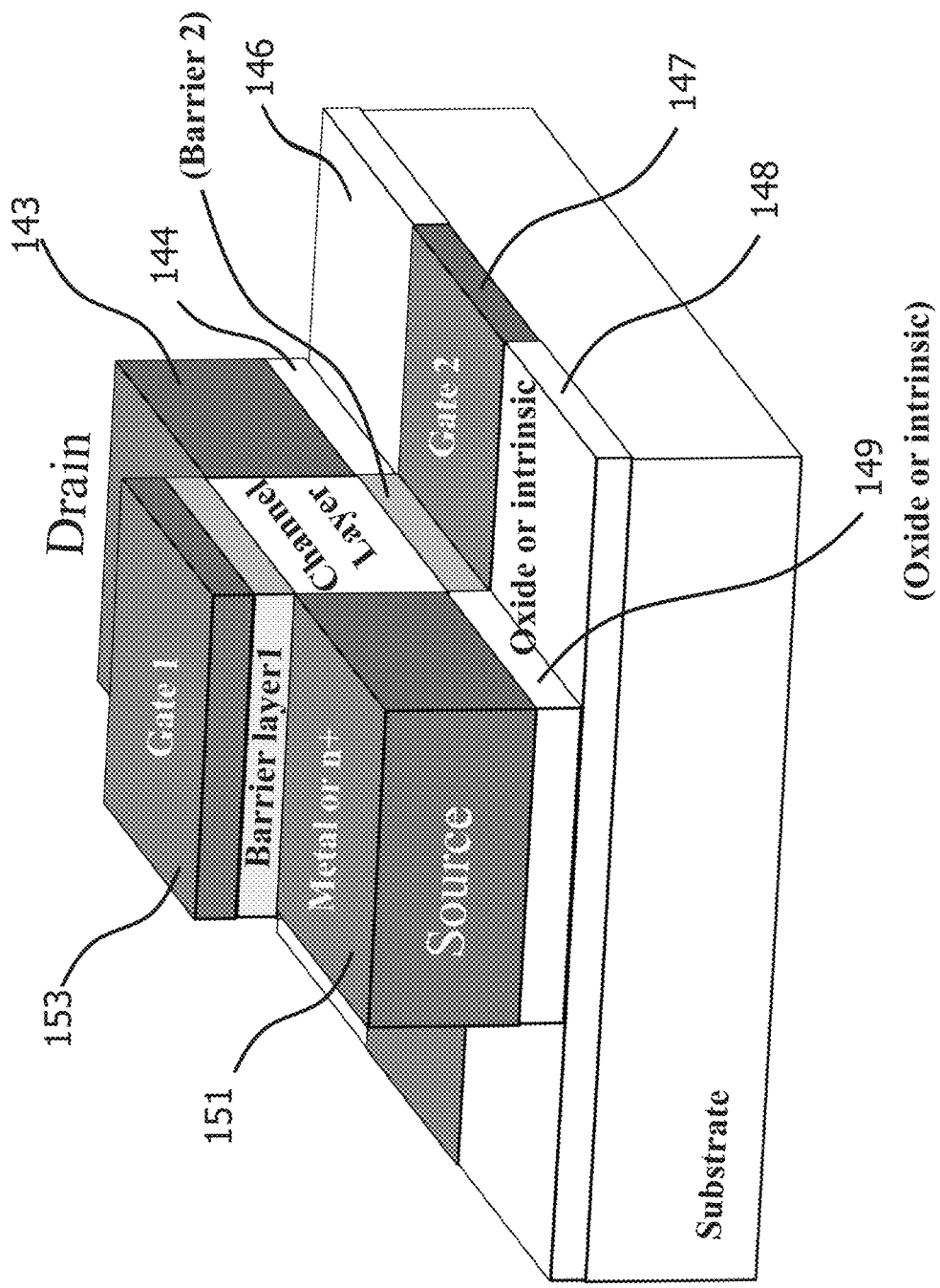
FIG. 12 shows a Double Gate Hetero-structure device according to a fourth embodiment of the invention.

In FIG. 12 i another interesting example of embodiment of the present invention is shown, where the source 151 and drain 143 regions have been auto aligned with the first gate 153. These two regions can be done in highly doped semiconductor or using metallic materials. In this second case the regions 144, 146, 148 and 149 under them can be formed with a dielectric material in order to isolate the device source and drain terminals from the second gate 147.

L FIG. 13

Figure 13:
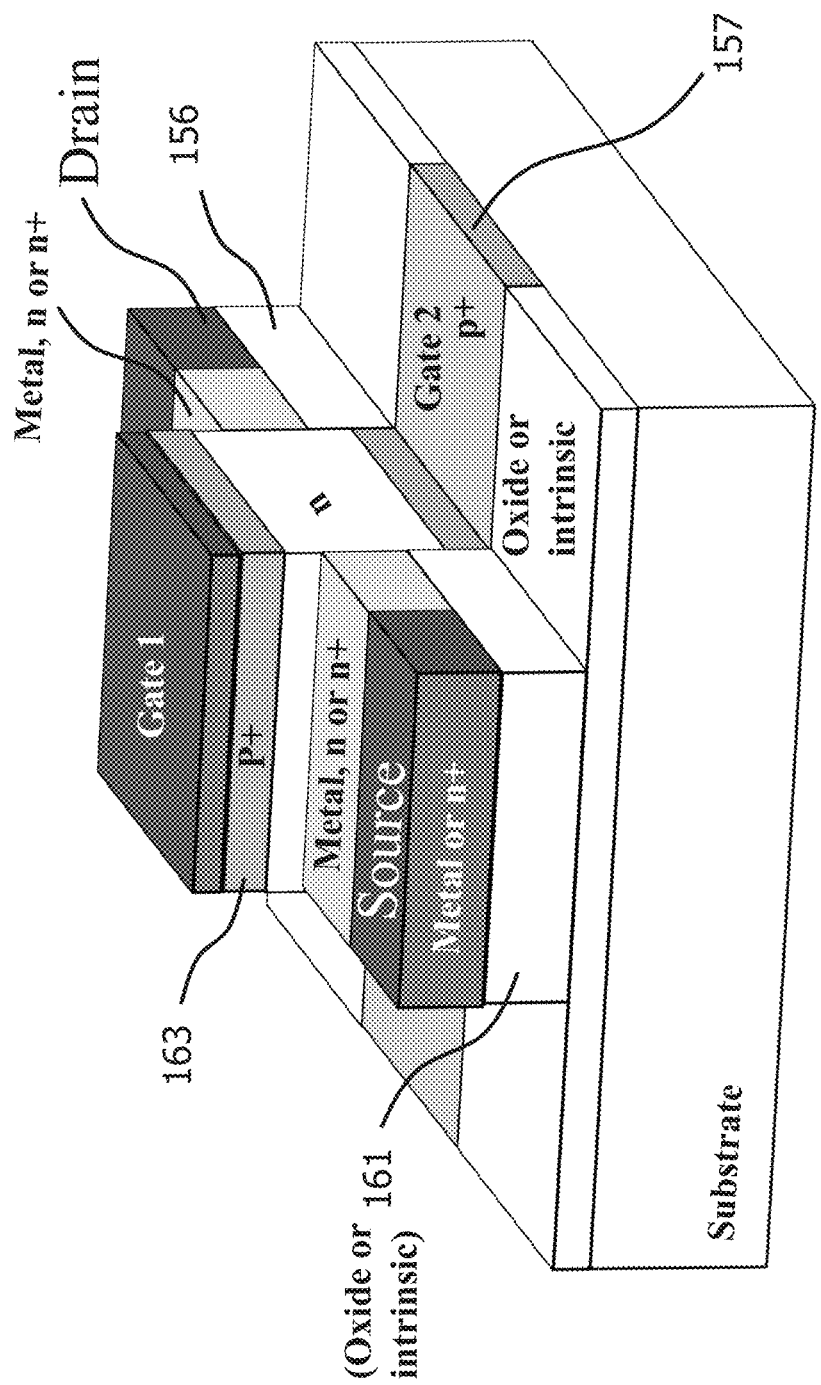
FIG. 13 shows a Double Gate JFET device according to a fifth embodiment of the invention.

All the structures discussed above can be realized also using a JFET configuration with small modifications. In this case the structures of FIG. 3-12 should be modified as shown in FIG. 13, in order to guarantee the isolation of the source and drain regions from the two gates layers 163 and 157. In this case, the device can be realized also in standard silicon CMOS technology with a simple extra process step.

M FIG. 14

Figure 14:
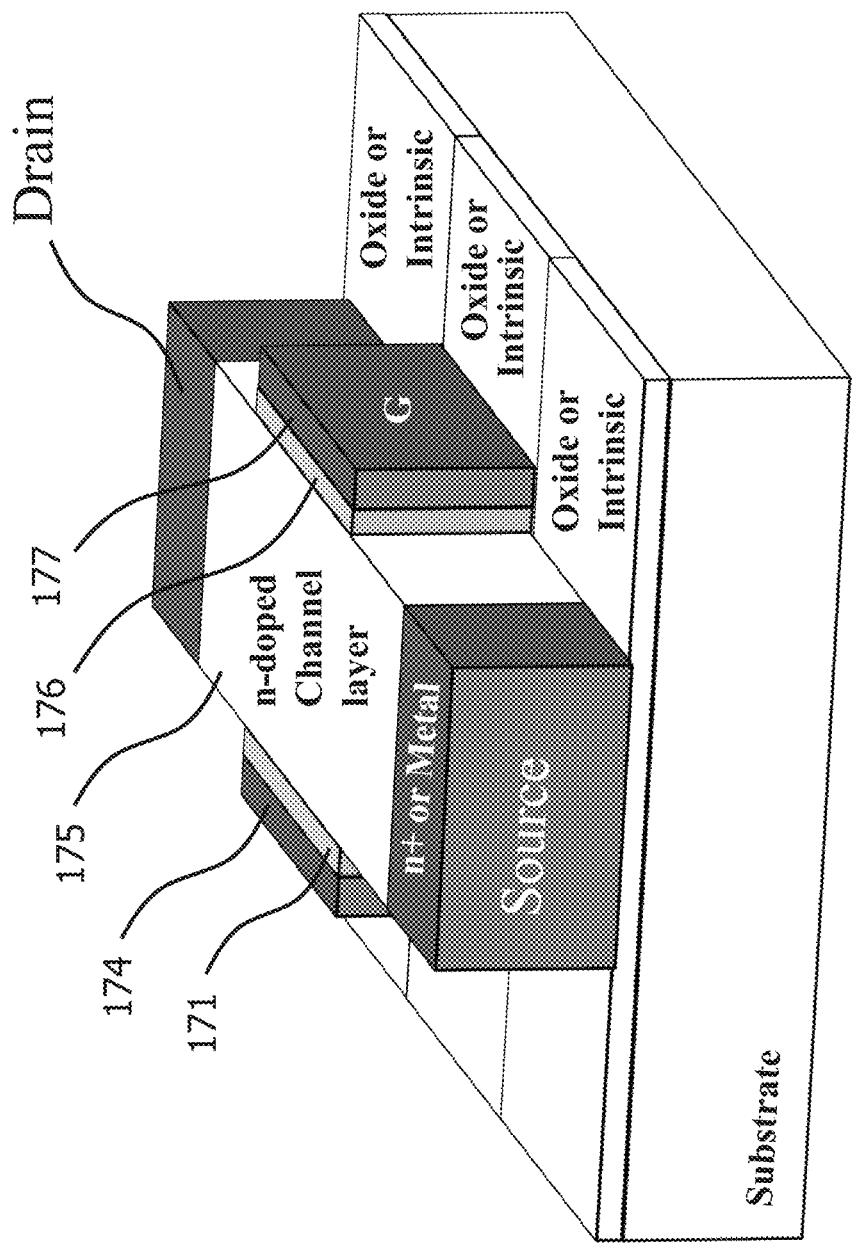
FIG. 14 shows a Double Gate device according to a sixth embodiment of the invention, where the two gate electrodes have been placed on laterally to the semiconductor fin.

Aside the stack configurations, all the embodiments described above can be realized also with lateral gates configuration as illustrated in FIG. 14. The laterals gates 174 and 177 can be also fabricated using Schottky contacts, in this case the two barrier layers 173 and 176 can be removed or can be highly p-doped in order to increase the Schottky barrier. The same structure can be used to obtain HFET or JFET devices.

N FIG. 15

Figure 15:
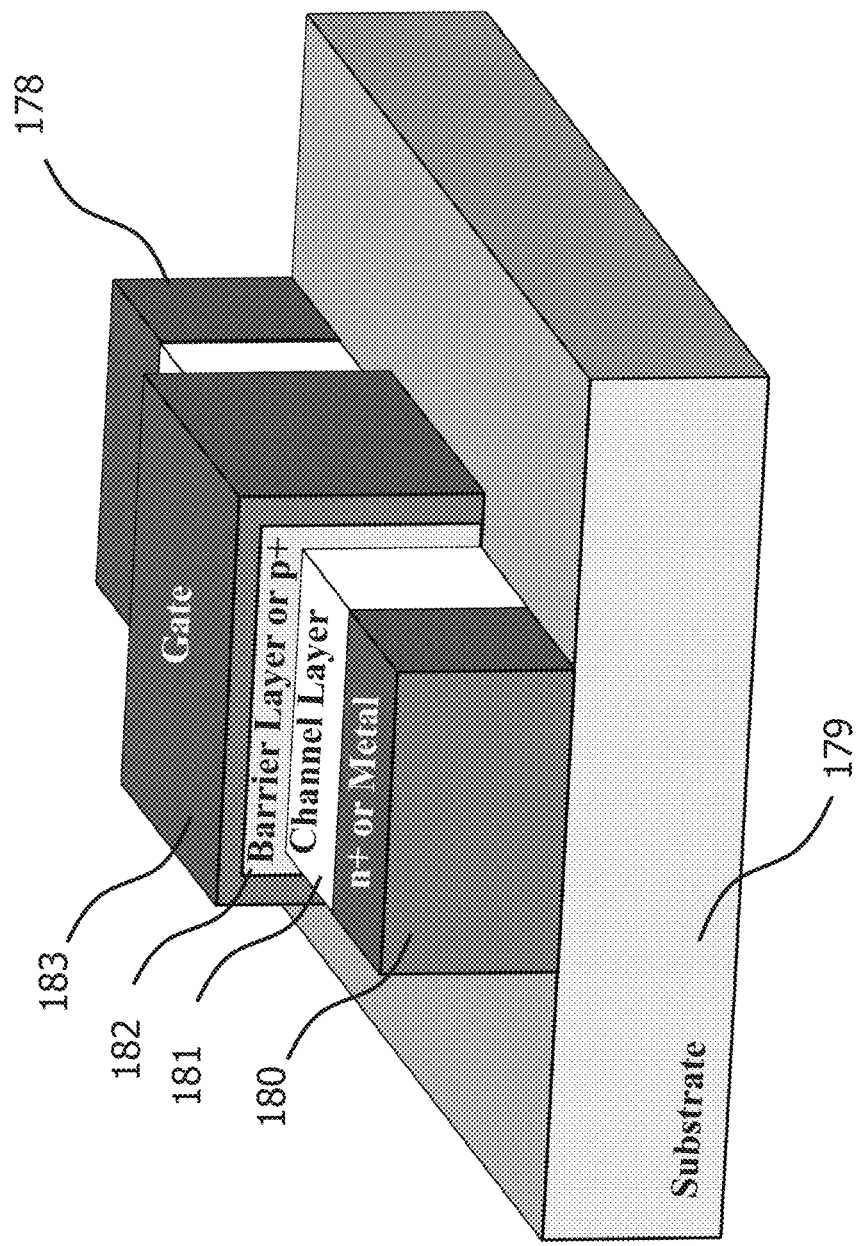
FIG. 15 shows a Triple Gate Hetero-structure device according to a seventh embodiment of the invention.

Another interesting embodiment of the present invention is illustrated in FIG. 15, where a triple-gate HFET is shown. In this case the barrier layer 182 and the gate 183 are surrounding three faces of the semiconductor FIN 181 increasing the control on the channel. This configuration can be utilized for all the structure described above, with particular emphasis on the implementations using non polar materials. Regions 180 and 178 are the source and drain regions, respectively.

O FIG. 16

Figure 16:
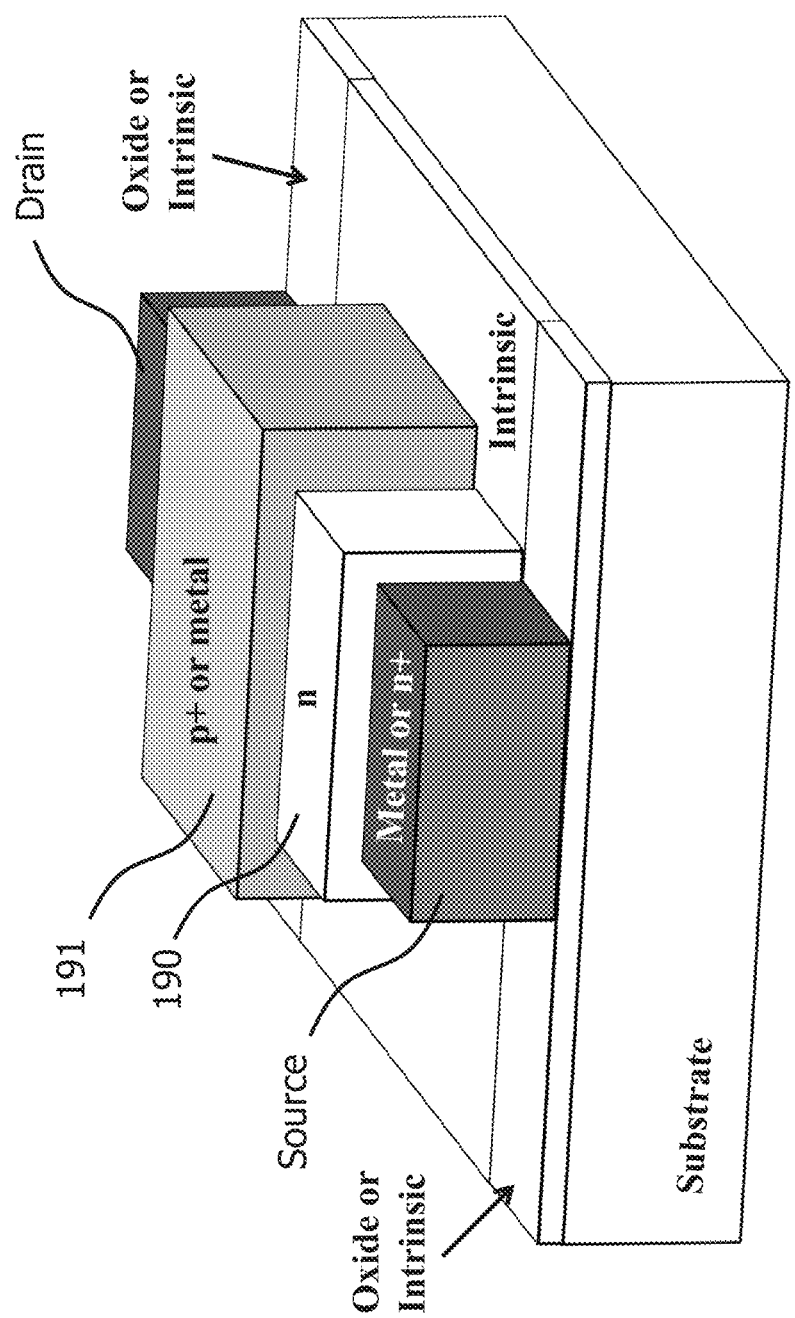
FIG. 16 shows a Triple Gate JFET or MESFET device according to an eighth embodiment of the invention.

FIG. 16 shows a variant to the triple gate structure of FIG. 15, where the device behaves as a JFET or MESFET transistor. In this case, the device can be formed using silicon semiconductor material, and (for the JFET configuration) the gate p+ layer 191 can be obtained depositing a p+ doped polysilicon layer, on the top of the channel region 190.

P FIG. 17

Figure 17:
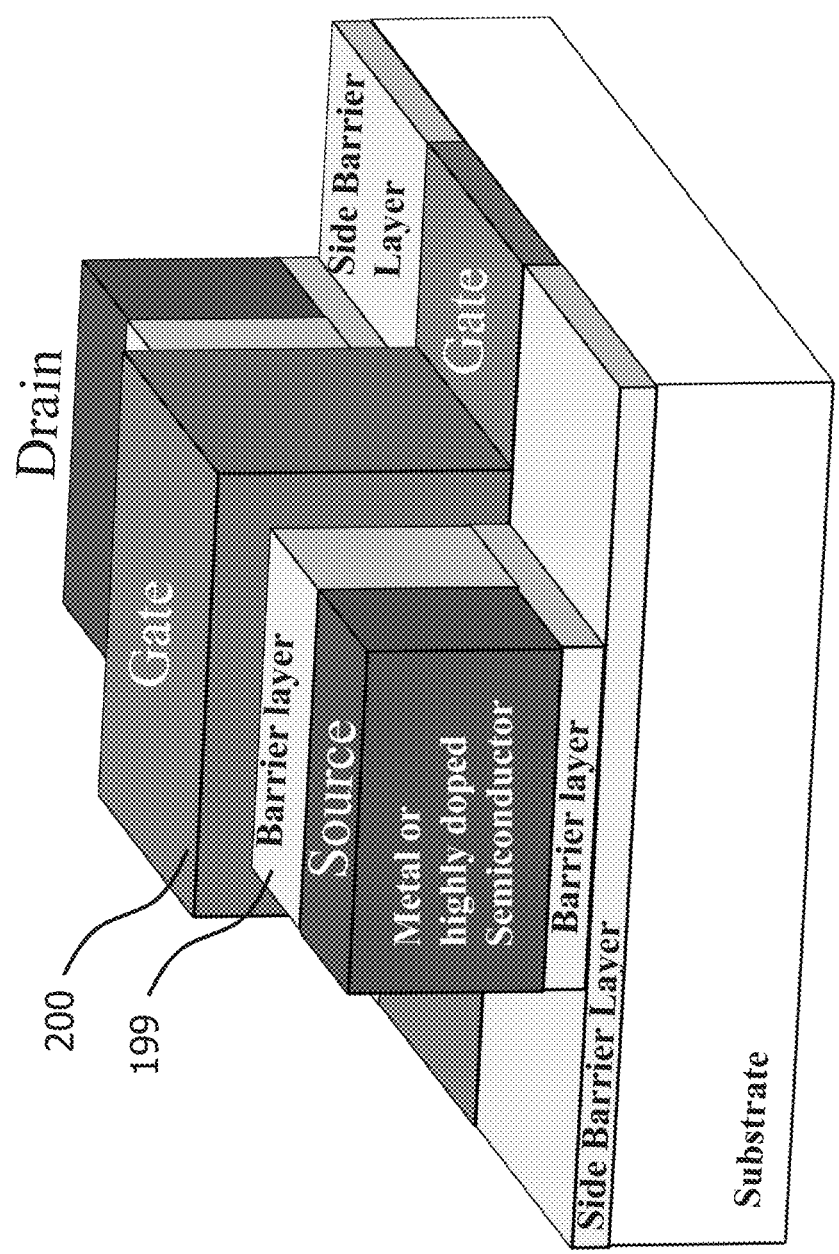
FIG. 17 shows a Gate-all-around HFET device according to a ninth embodiment of the invention.

FIG. 17 shows how to obtain a gate-all-around structure utilizing a HFET configuration. This structure can have many advantages over the other embodiment, however it is more difficult to realize from a process view point. In this case, a gate region 200 and the barrier layer 199 surround the tridimensional channel region of the device.

Q FIG. 18

Figure 18:
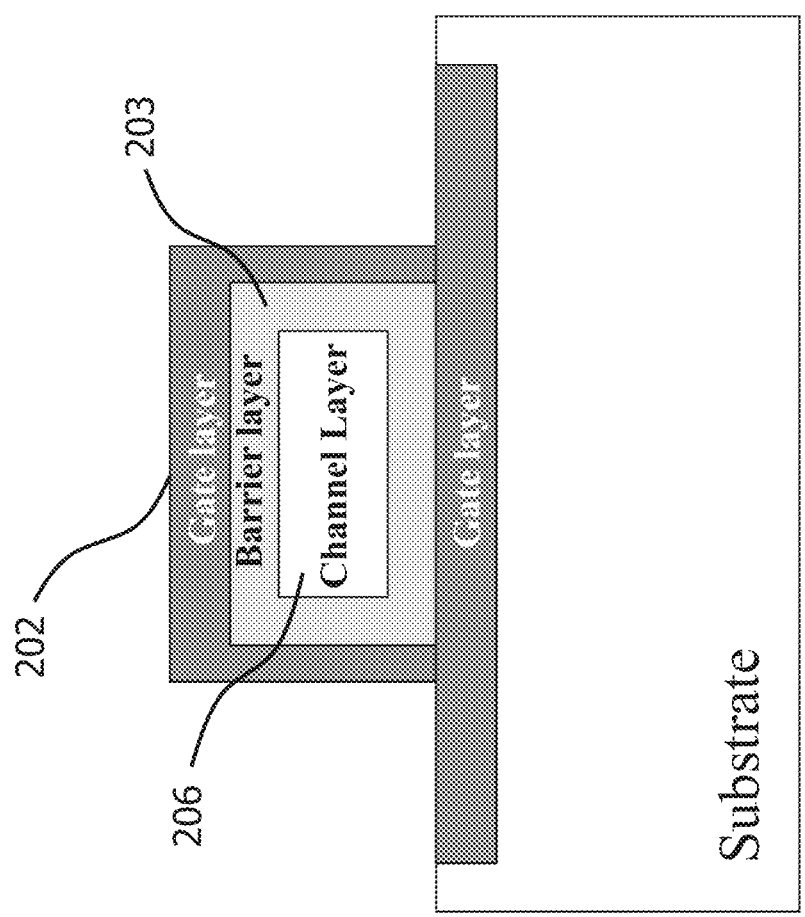
FIG. 18 shows a cross section of the Gate-all-around HFET illustrated in FIG. 17

For clarity, in FIG. 18 is illustrated a cross-section perpendicular to the carrier transport for the device shown in FIG. 17. As it can be seen, a gate region 202 and a barrier layer 203 surround the device channel 206, optimizing the control on the carrier transport.

R FIG. 19

Figure 19:
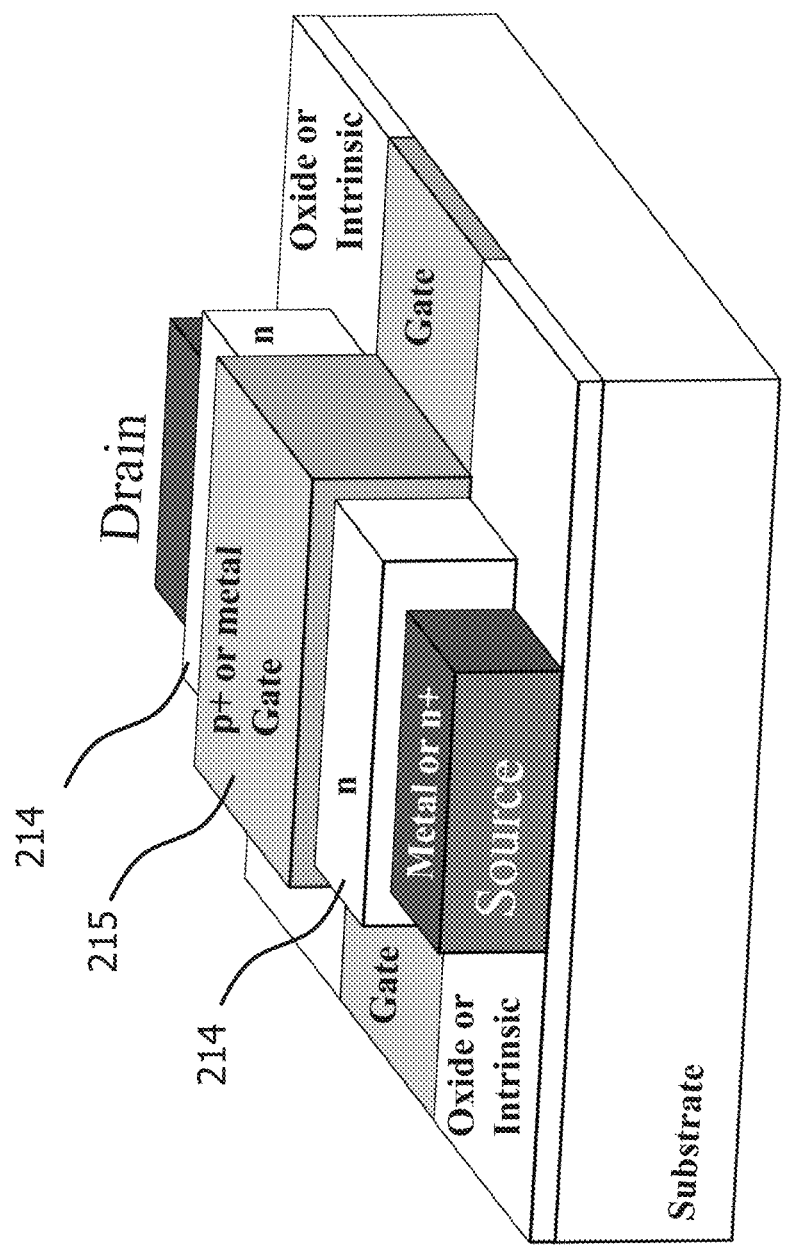
FIG. 19 shows a Gate-all-around JFET device according to a tenth embodiment of the invention.

In FIG. 19 the JFET version of the gate-all-around HFET structure discussed above is shown. In this case, as in the previous one, the contacts may or may not be auto-aligned with the gate, depending on the materials used to form the source and drain regions. Also in this case, the gate region 215 surrounds the channel layer 214.

S FIG. 20

Figure 20:
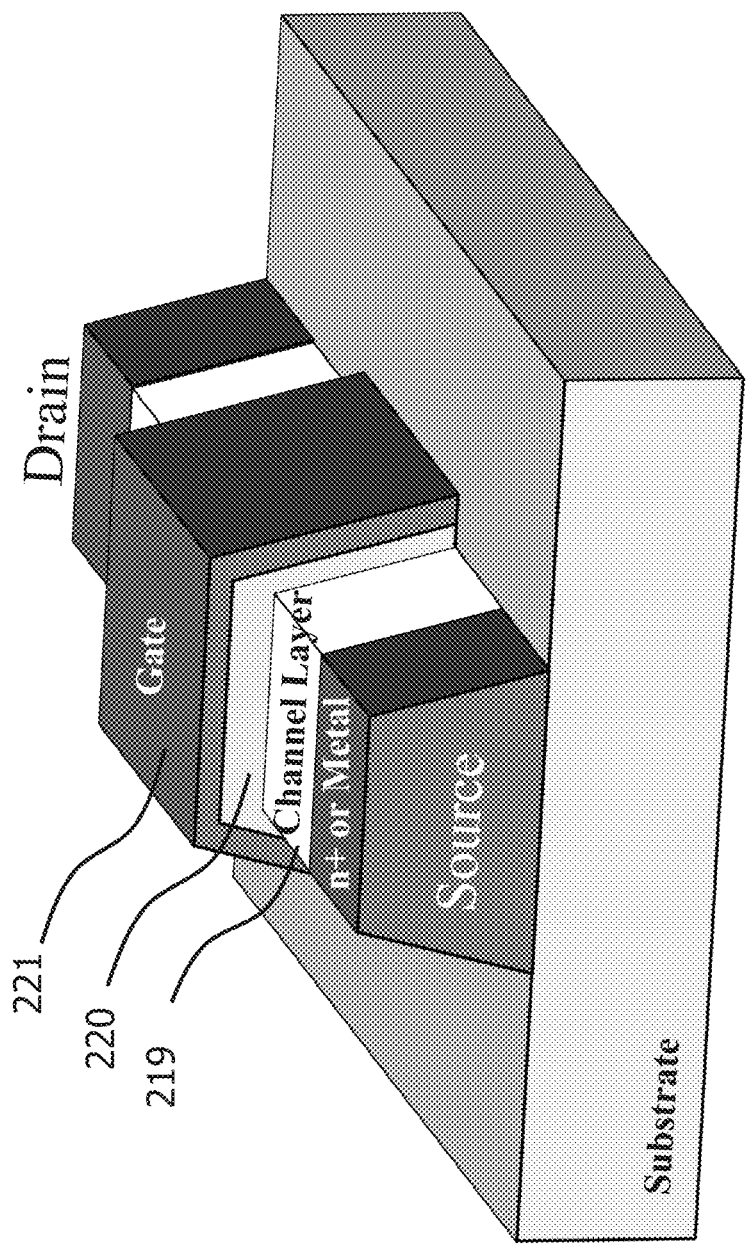
FIG. 20 shows a semiconductor device according to an eleventh embodiment of the invention, where the fin structure has a trapezoidal shape.

For all the structures described above, the semiconductor FIN can also have a trapezoidal shape, in order to simplify the fabrication process. An example, is shown in FIG. 20, where a trapezoidal triple-gate JFET, MESFET, HEMT or HFET device is illustrated. In this case the tridimensional region 219 corresponding to the channel region has a trapezoidal cross section and is surrounded on three sides from the barrier region 220 and the gate region 221.

T FIG. 21

Figure 21:
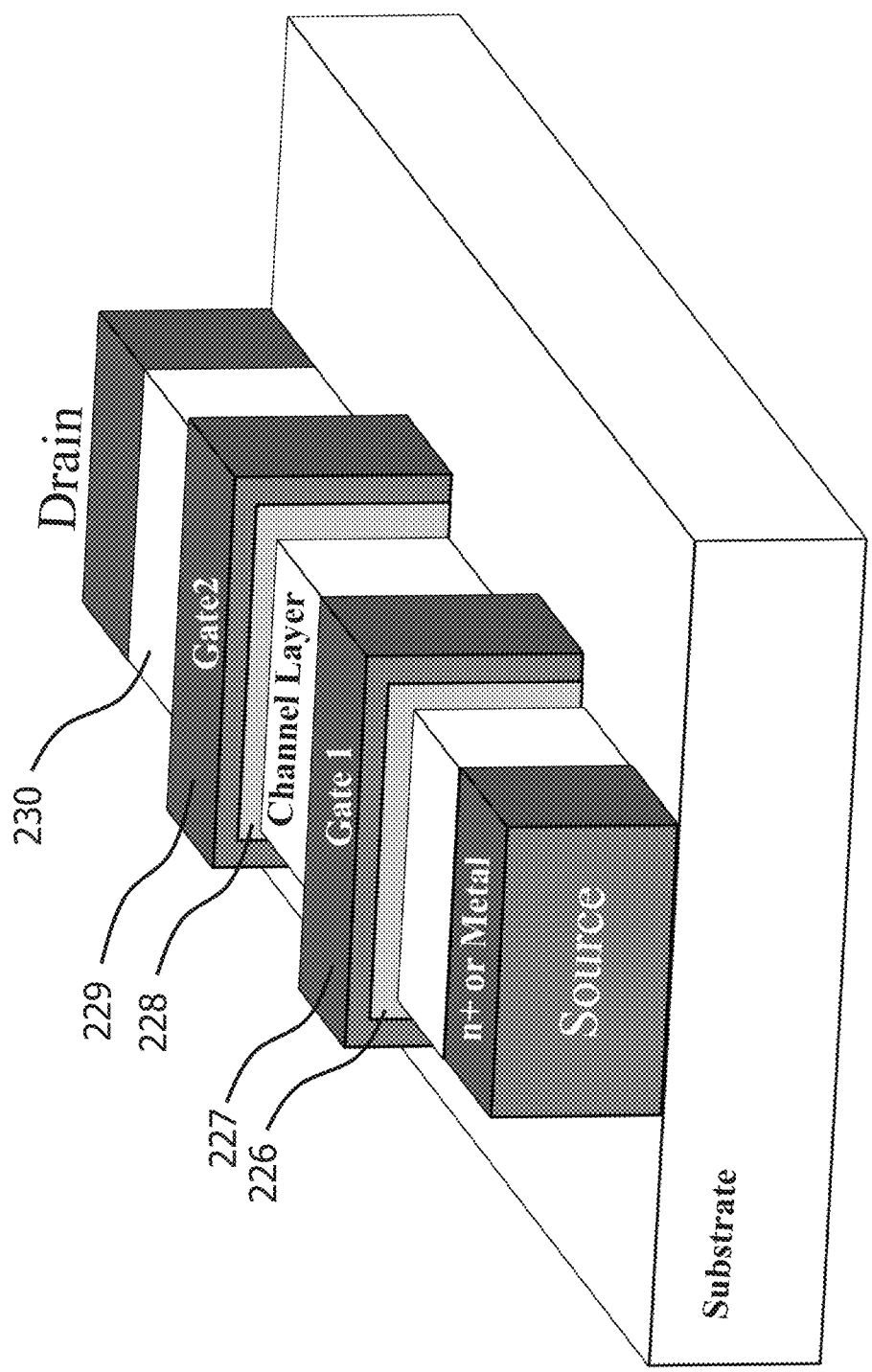
FIG. 21 shows a dual gate semiconductor device according to a twelfth embodiment of the invention, where a second gate has been added to the device.

For all the structures previously discussed, a dual gate version can be obtained. An example is illustrated in FIG. 21, where a second gate terminal 229 has been added to a triple-gate FET device. 226 and 228 are two barrier layers surrounding the channel region 230. 227 is a first gate and 229 is a second gate.

For all the FET structures described above, the p-channel version can be obtained. Furthermore, most of the presented device structures can be realized in standard HFET fabrication process. In particular, in the case of FIG. 2-12, the two (or more) extra layer are deposited and, if necessary, doped at the beginning of the process in order to create the extra FET structure under the device. By means of a simple semiconductor etching step, the semiconductor FIN can be then formed on the substrate surface.

The devices structure shown in FIG. 13, FIG. 14, FIG. 16, FIG. 19, and FIG. 20, FIG. 21 (when realized in JFET or MESFET configuration), can be made also in standard silicon CMOS technology. By means of a simple silicon etching step at the beginning of the CMOS process, the semiconductor FIN can be formed on the substrate surface. This makes the present invention very cost effective.

The materials used in the fabrication process of the structures discussed herein, can comprise any type of semiconductor materials, including II-VI semiconductor compound, III-V polar (such as GaN, AlN, InN etc. and their alloys) and non polar (such as GaAs, AlAs, InAs etc. and their alloys) materials, and/or in some case Silicon, sapphire, and SiC etc. In the case where polar materials such as III-Nitride materials are used, particular attention must be paid to the molar fraction and the doping profiles used in the different layers forming the device. Extra layers can be also added to the structure in order to improve the device performance.

Although the present invention has been described above with particularity, this was merely to teach one of ordinary skill in the art how to make and use the invention. Many additional modifications will fall within the scope of the invention. Thus, the scope of the invention is defined by the claims which immediately follow.

What is claimed is:

1. A semiconductor hetero-structure field effect transistor comprising:
    a carrier transport layer;
    a first barrier layer;
    a substrate semiconductor layer;
    wherein said semiconductor hetero-structure field effect transistor is a multi-gate field effect transistor;
    wherein all gates of said multi-gate field effect transistor are shorted together;
    wherein a first gate of said multi-gate field effect transistor is made of a semiconductor material;
    wherein said semiconductor hetero-structure field effect transistor is a carrier density modulation field effect transistor;
    wherein, when said semiconductor hetero-structure field effect transistor is a n-channel field effect transistor, said first gate is doped with p-type impurities;
    wherein said first barrier layer is formed above and in physical contact with said carrier transport layer;
    wherein said carrier transport layer is formed above said first gate;
    wherein said first gate is formed above and in physical contact with said substrate semiconductor layer;
    wherein said semiconductor field effect transistor comprises a source and a drain placed at opposite ends of said carrier transport layer along a first direction, and
    wherein said first gate extends beyond said carrier transport layer along a second direction, said second direction being perpendicular to said first direction and parallel to a top surface of said substrate semiconductor layer.

2. The semiconductor hetero-structure field effect transistor of claim 1
    wherein at least a portion of said carrier transport layer is formed in a tridimensional semiconductor region extending above the top surface of said substrate semiconductor layer;
    wherein a cross-section of said tridimensional semiconductor region has a shape resembling one of the geometric shapes belonging to the group consisting of trapezoidal and rectangular shapes, and
    wherein said cross-section is laying on a geometric plane orthogonal to the first direction.

3. The semiconductor hetero-structure field effect transistor of claim 1 further comprising:
    a second barrier layer formed above at least a portion of said first gate; wherein said carrier transport layer is formed above and in physical contact with said second barrier layer; and
    wherein said carrier transport layer extends continuously from said source to said drain of said semiconductor hetero-structure field effect transistor, and wherein a second gate of said multi-gate field effect transistor is formed above at least a portion of said first barrier layer.

4. The semiconductor hetero-structure field effect transistor of claim 1 wherein at least one of said source and drain is self-aligned with at least one of said gates of said semiconductor hetero-structure field effect transistor.

5. The semiconductor hetero-structure field effect transistor of claim 1 wherein said carrier transport layer is made of a material belonging to the group consisting of polar and non-polar III-V compounds semiconductors, polar and non-polar II-VI compounds semiconductors, and semiconductors materials comprising elements of the IV group of the periodic table.

6. The semiconductor hetero-structure field effect transistor of claim 1 comprising an insulating buried layer under at least a portion of said semiconductor hetero-structure field effect transistor.

7. The semiconductor hetero-structure field effect transistor of claim 1 wherein said semiconductor hetero-structure field effect transistor is an enhancement mode field effect transistor.

8. The semiconductor hetero-structure field effect transistor of claim 1, wherein at least a portion of said carrier transport layer is formed in a semiconductor fin extending above the top surface of said substrate semiconductor layer, and wherein said first gate is directly contacted with a gate electrode on a lateral side of said semiconductor fin.

9. The semiconductor hetero-structure field effect transistor of claim 1, wherein at least a portion of said carrier transport layer is formed in a semiconductor fin extending above the top surface of said substrate semiconductor layer.

10. A semiconductor field effect transistor comprising: a tridimensional semiconductor region formed in a semiconductor fin extending above a top surface of a substrate semiconductor layer;
wherein a carrier transport layer is formed in said tridimensional semiconductor region;
wherein said semiconductor field effect transistor is a multi-gate field effect transistor;
wherein said semiconductor field effect transistor is a carrier density modulation field effect transistor;
wherein a first gate of said semiconductor field effect transistor is in direct contact with and forms a junction with said tridimensional semiconductor region, the junction type belonging to the group consisting of a rectifying junction and a hetero-junction;
wherein, when said first gate is in physical contact with a bottom side of said tridimensional semiconductor region, said first gate is made of a semiconductor material, and is formed above and in physical contact with said substrate semiconductor layer;
wherein said semiconductor field effect transistor comprises a source and a drain;
wherein said source and drain are in direct contact with said tridimensional semiconductor region at opposite ends of said carrier transport layer along a first direction, and
wherein said first gate extends beyond said carrier transport layer along a second direction, said second direction being perpendicular to said first direction and parallel to the top surface of said substrate semiconductor layer.

11. The semiconductor field effect transistor of claim 10, wherein said tridimensional semiconductor region further comprises a first barrier layer and a second barrier layer;
wherein said first barrier layer is formed above at least a portion of said first gate;
wherein said carrier transport layer is formed above and directly in contact with at least a portion of said first barrier layer, and
wherein said second barrier layer is formed above and directly in contact with at least a portion of said carrier transport layer, and
wherein a second gate of said semiconductor field effect transistor is formed above at least a portion of said second barrier layer.

12. The semiconductor field effect transistor of claim 10 wherein at least a portion of said semiconductor field effect transistor comprises at least one of the structures belonging to the group consisting of a Hetero-structure FET (HFET), a High Electron Mobility Transistor (HEMT), a Metal Semiconductor FETs (MESFET), and a Junction FET (JFET) structures.

13. The semiconductor field effect transistor of claim 10, wherein at least one of said source and said drain is self-aligned with at least one gate of said semiconductor field effect transistor.

14. The semiconductor field effect transistor of claim 10 wherein said carrier transport layer is made of a material belonging to the group consisting of polar and non-polar III-V compounds semiconductors, polar and non-polar II-VI compounds semiconductors, and semiconductors materials comprising elements of the IV group of the periodic table.

15. The semiconductor field effect transistor structure of claim 10 wherein said first gate is made of said semiconductor material.

16. The semiconductor field effect transistor of claim 10,
wherein said first gate is made of said semiconductor material;
wherein said semiconductor field effect transistor is a re-channel field effect transistor, and said first gate is doped with p-type impurities.

17. The semiconductor field effect transistor of claim 10,
wherein said first gate is made of said semiconductor material;
wherein said first gate is in physical contact with said bottom side of said tridimensional semiconductor region, and
wherein said first gate is directly contacted with a gate electrode on a lateral side of said tridimensional semiconductor region.

18. The semiconductor field effect transistor of claim 10 wherein all gates of said multi-gate field effect transistor are shorted together.

19. The semiconductor field effect transistor of claim 10, wherein said semiconductor field effect transistor is an enhancement mode field effect transistor.

* * * * *